(12) United States Patent
Colleran et al.

(10) Patent No.: US 7,304,544 B2
(45) Date of Patent: *Dec. 4, 2007

(54) AUTOMATIC PHASE LOCK LOOP DESIGN USING GEOMETRIC PROGRAMMING

(75) Inventors: Dave Colleran, San Jose, CA (US); Arash Hassibi, Mountain View, CA (US)

(73) Assignee: Sabio Labs, Inc., Mountain View, CA (US)

( * ) Notice: Subject to any disclaimer, the term of this patent is extended or adjusted under 35 U.S.C. 154(b) by 316 days.

This patent is subject to a terminal disclaimer.

(21) Appl. No.: 10/810,444

(22) Filed: Mar. 26, 2004

(65) Prior Publication Data

US 2004/0230408 A1 Nov. 18, 2004

Related U.S. Application Data

(63) Continuation of application No. 10/119,347, filed on Apr. 7, 2002, now Pat. No. 6,909,330.

(51) Int. Cl.
*G06F 17/50* (2006.01)
*H03L 7/00* (2006.01)

(52) U.S. Cl. .......................................... 331/8; 716/18

(58) Field of Classification Search ................ 331/1 R, 331/1 A, 8, 18, 25; 716/18
See application file for complete search history.

(56) References Cited

U.S. PATENT DOCUMENTS 4,827,428 A   5/1989  Dunlop et al.
5,055,716 A  10/1991  El Gamel
5,289,021 A   2/1994  El Gamal
5,633,807 A   5/1997  Fishburn et al.
5,754,826 A   5/1998  Gamal et al.
5,973,524 A  10/1999  Martin
6,002,860 A  12/1999  Voinigescu et al.
6,269,277 B1  7/2001  Hershenson et al.
6,311,145 B1 10/2001  Hershenson et al.
6,311,315 B1 10/2001  Tamaki
6,381,563 B1  4/2002  O'Riordan et al.
6,425,111 B1  7/2002  del Mar Hershenson
6,532,569 B1  3/2003  Christen et al.
6,539,533 B1  3/2003  Brown, III et al.
6,574,786 B1  6/2003  Pohlenz et al.

(Continued)

FOREIGN PATENT DOCUMENTS

WO    WO 01/37429 A1    5/2001

OTHER PUBLICATIONS

Chan, Shu-Park; "Analysis of Linear Networks and Systems", Addison-Wesley Publishing Company, 1972, pp. 23-25, 46 and 47.

(Continued)

*Primary Examiner*—David Mis
(74) *Attorney, Agent, or Firm*—Blakely, Sokoloff, Taylor & Zafman LLP

(57) ABSTRACT

A method is described that involves developing a more detailed description of a phase lock loop system by substituting, into a monomial or posynomial equation that is part of a family of monomial and posynomial expressions that describe functional characteristics of the PLL at the system level, a lower level expression that describes a characteristic of one the PLL's basic building blocks.

6 Claims, 30 Drawing Sheets

U.S. PATENT DOCUMENTS

| | | |
|---|---|---|
| 6,577,992 B1 | 6/2003 | Deng et al. |
| 6,578,179 B2 | 6/2003 | Shirotori et al. |
| 6,581,188 B1 | 6/2003 | Hosomi et al. |
| 6,588,002 B1 | 7/2003 | Lampaert et al. |
| 6,813,590 B1 | 11/2004 | Crusius |
| 6,909,330 B2 * | 6/2005 | Colleran et al. ............... 331/8 |
| 2004/0172609 A1 | 9/2004 | Hassibi et al. |

OTHER PUBLICATIONS

Kortanek, K.O., et al., "An Infeasible Interior-Point Algorithm For Solving Primal and Dual Geometric Programs," pp., 155-181, Mathematical Programming Society, Inc., 76:155-181, Jan. 1, 1995.

Gielen, G., et al., "An Analogue Module Generator For Mixed Analogue/Digital ASIC Design", International Journal of Circuit Theory and Applications, vol. 23, pp. 269-283, 1995.

Hershenson, M., et al., "Automated Design of Folded-Cascode Op-Amps with Sensitivity Analysis", pp. 121-124, Electronics, Circuits and Systems, IEEE International Conference on LISBOA, Sep. 7-10, 1998.

Hershenson, M., et al., "Optimization of Inductor Circuits via Geometric Programming", pp. 994-998, Design Automation Conference, Jun. 21, 1999, Proceedings.

Mediero, F., et al., "A Vertically Integrated Tool For Automated Design Of Sigma Delta Modulators", IEEE Journal of Solid-State Circuits, vol. 30., No. 7, Jul. 1, 1995, pp. 762-767.

Hershenson, M., et al., "Optimal Design Of A CMOS Op-Amp Via Geometric Programming", IEEE Transactions On Computer Aided Design Of Integrated Circuits And Systems, vol. 20., N. Jan. 1, 2001, pp. 1-21.

Mandal, P., et al., "CMOS Op-Amp Sizing Using A Geometry Programming Formulation", IEEE Transactions On Computer Aided Design Of Integrated Circuits And Systems, vol. 20., No. 1, Jan. 31, 2001, pp. 22-38.

Daems, W., et al., "Simulation-based Automatic Generation Of Signomial And Posynomial Performance Models For Analog Integrated Circuit Sizing", IEEE/ACM International Conference On Computer-Aided Design, Nov. 4, 2001, pp. 70-74.

Von Kaenel, V., et al., "A 320MHz, 1.5mW at 1.36V CMOS PLL For Microprocessor Clock Generation", IEEE Solid-State Circuits Conference, Feb. 9, 1996, Digest of Technical Papers, 42nd ISSCC96/ Session 8 / Digital Clock and Latches / Paper FA 8.2.

Young, et al., "A PLL Clock Generator with 5 to 110 MHz of Lock Range for Microprocessor", IEEE Journal of Solid-State Circuits, vol. 27, No. 11, Nov. 1992, pp. 1599-1607.

Novof, et al., "Fully Integrated CMOS Phase-Locked Loop with 15 to 240 MHz Locking Range and + 50 ps Jitter", IEEE Journal of Solid-State Circuits, vol. 30., No. 11, Nov. 1995, pp. 1259-1266.

Mohan, et al., "Simple Accurate Expressions for Planar Spiral Inductances", IEEE Journal of Solid-State Circuits, vol. 34, No. 10, Oct. 1999, pp. 1419-1424.

Hershenson, "CMOS Analog Circuit Design Via Geometric Programming", A Dissertation Submitted to the Department of Electrical Engineering and the Committee on Graduate Studies of Stanford University, Nov. 2003, 235 pages.

Hershenson, M., et al., "GPCAD: A Tool for CMOS Op-Amp Synthesis" 8 pages, Proceedings of the IEEE/ACM International Conference on Computer Aided Design (ICCAD), pp. 296-303, Nov. 1998.

Hershenson, M., et al., "Posynomial models for MOSFETs" 9 pages, Jul. 7, 1998.

Chang, H, et al., "A Top-Down, Constraint-Driven Design Methodology for Analog Integrated Circuits" 6 pages, IEEE 1992 Custom Integrated Circuits Conference.

Chavez, J., et al, "Analog Design Optimization: A Case Study" 3 pages, IEEE, Jan. 1993.

Geilen, G., et al., "Analog Circuit Design Optimization Based on Symbolic Simulation and Simulated Annealing", pp. 707-713, IEEE Journal of Solid-State Circuits, vol. 25, No. 3, Jun. 1990.

Fishburn, J, et al., "TILOS: A Posynomial Programming Approach to Transistor Sizing" pp. 326-328, IEEE, 1985.

Maulik, P., et al., "Integer Programming Based on Topology Selection of Cell-Level Analog Circuits", 12 pages, IEEE Transactions On Computer-Aided Design Of Integrated Circuits And Systems, vol. 14, No. 4, Apr. 1995.

Swings, K., et al., "An Intelligent Analog IC Design System Based On Manipulation Of Design Equations" pp. 8.6.1-8.6.4, IEEE 1990, Custom Integrated Circuits Conference.

Nesterov, Y., et al., "Interior-Point Polynomial algorithms in Convex Programming" 8 pgs., 1994, Society for industrial and Applied mathematics.

Yang, H.Z., et al., "Simulated Annealing Algorithm with Multi-Molecule: an Approach to Analog Synthesis" pp. 571-575, IEEE, 1996.

Wong, D.F., et al., "Simulated Annealing For VLSI Design" 6 pages, 1998, Kulwer Academic Publishers.

Maulik, P., et al., "Sizing of Cell-Level Analog Circuits Using Constrained Optimization Techniques" pp. 233-241, IEEE Journal of Solid-State Circuits, vol. 28, No. 3, Mar. 1993.

Ochotta, E, et al., "Synthesis of High -Performance Analog Circuits in ASTRX/OBLS" pp. 273-295, IEEE Transactions on Computer-Aided Design of Integrated Circuits And Systems, vol. 15, No. 3, Mar. 1996.

Wright, S., "Primal-Dual Interior-Point Methods" pp. 1-3, http://www.siam.org/books/wright, Printed Aug. 19, 1998.

Shyu, J., et al., "Optimization-Based Transistor Sizing" pp. 400-408, IEEE Journal of Solid-State Circuits, vol. 23, No. 2, Apr. 1998.

Wright, S., "Primal-Dual Interior-Point Methods" 14 pages, 1997, Society for Industrial and Applied Mathematics.

Van Laarhoven, P.J.M., et al., "Simulated Annealing: Theory and Applications" 26 pages, 1987, Kulwer Academic Publishers.

Hershenson, M., et al., "CMOS Operational Amplifier Design and Optimization via Geometric Programming" pp. 1-4, Analog Integrated Circuits, Stanford University.

Aguirre, M.A., et al., "Analog Design Optimization by means of a Tabu Search Approach" pp. 375-378.

Medeiro, F., et al., "A Statistical Optimization-Based Approach for Automated Sizing of Analog Cells", pp. 594-597, Dept. of Analog Circuit Design.

Spatnekar, S., "Wire Sizing as a Convex Optimization Problem: Exploring the Area-Delay Tradeoff" 27 pages, Dept. of Electrical and Computer Engineering.

Su, H., et al., "Statistical Constrained Optimization of Analog MOS Circuits Using Empirical Performance Models" pp. 133-136.

Vassiliou, I., et al, "A Video Driver System Designed Using a Top-Down, Constraint-Driven Methodology" 6 pages.

Sapatnekar, S, et al., "An Exact Solution to the Transistor Sizing Problems for CMOS Circuits Using Convex Optimization" 35 pages.

Bowman, R., "An Imaging Model For Analog Macrocell Layout Generation", IEEE International Symposium On Circuits And Systems, vol. 2, May 8, 1989, pp. 1127-1130, XP010085007.

* cited by examiner

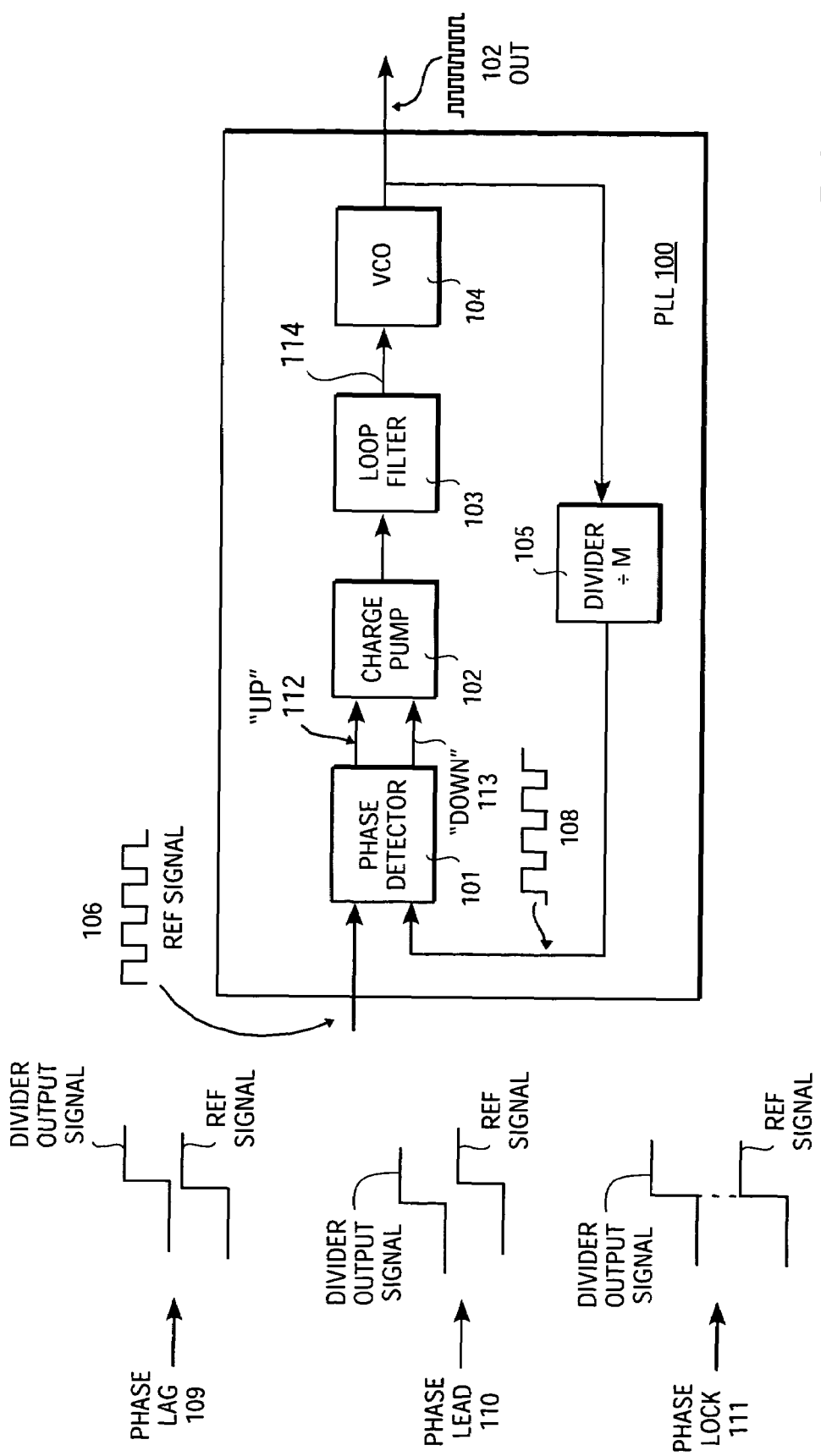

$$301\begin{cases} M1 = \text{PMOS; GATE WIDTH} = W_1; \text{GATE LENGTH} = L_1 \\ M2 = \text{PMOS; GATE WIDTH} = W_2; \text{GATE LENGTH} = L_2 \\ M3 = \text{NMOS; GATE WIDTH} = W_3; \text{GATE LENGTH} = L_3 \\ M4 = \text{NMOS; GATE WIDTH} = W_4; \text{GATE LENGTH} = L_4 \\ M5 = \text{PMOS; GATE WIDTH} = W_5; \text{GATE LENGTH} = L_5 \\ M6 = \text{NMOS; GATE WIDTH} = W_6; \text{GATE LENGTH} = L_6 \\ M7 = \text{PMOS; GATE WIDTH} = W_7; \text{GATE LENGTH} = L_7 \\ M8 = \text{PMOS; GATE WIDTH} = W_8; \text{GATE LENGTH} = L_8 \end{cases}$$

$I_{BIAS} = I$ AMPS
$R_C = R$ OHMS
$C_C = C$ CARADS $$302\begin{cases} 1 = V_{DD}; M8_{SOURCE}; M5_{SOURCE}; M7_{SOURCE} \\ 2 = M1_{GATE} \\ 3 = M2_{GATE} \\ 4 = C_C 2; M6_{DRAIN}; M7_{DRAIN} \\ 5 = M5_{GATE}; M7_{GATE}; M8_{GATE}; I_{BUS} 1 \\ 6 = M1_{SOURCE}; M2_{SOURCE}; M5_{DRAIN} \\ 7 = M1_{DRAIN}; M3_{DRAIN}; M3_{GATE}; M4_{GATE} \\ 8 = M2_{DRAIN}; R_C 1; M4_{DRAW}; M6_{GATE} \\ 9 = R_C 2; C_C 2 \\ 10 = V_{SS}; I_{BUS} 2; M3_{SOURCE}; M4_{SOURCE}; M6_{SOURCE} \end{cases}$$

- SILICON SURFACE AREA CONSUMPTION = A CM$^2$
- POWER CONSUMPTION = B mW
- OPEN LOOP GAIN = C dB
- UNITY GAIN BANDWIDTH = D MH$_z$
- SLEW RATE = E V/$_{nsec}$

PLL.AREA = PFD.AREA + CP.AREA + LF.AREA + VCO.AREA + DIV.AREA ← 62

PLL.POWER = PFD.PWR + CP.PWR + VCO.PWR + DIV.PWR ← 622

STATIC PHASE ERROR:

$$\text{PLL.SPE} = 0(\text{PLL.DELTA\_T\_STD\_DEV}) + \text{PFD.DELTA\_TERROR} + \text{CP.DELTA\_IP}(\text{PFI\_TRESET}) + \frac{\text{CP.DELTA\_QSTAT}}{\text{CP.IP}} \leftarrow 623$$
← 623a, 623b, 623c, 623d $$\text{PLL.DELTA\_T\_STD\_DEV} = (\text{PLL.DELTA\_T\_STD\_DEV\_SQUARED})^{0.5} \leftarrow 624$$

$$\text{PLL.DELTA\_T\_STD\_DEV\_SQUARED} = \text{PFP.VARIANCE\_TERROR} + \frac{\text{CP.IP\_VARIANCE}(\text{PF\_TRESET})^2}{(\text{CP.IP})^2} + \frac{\text{CP.VARIANCE\_QSTAT}}{(\text{CP.IP})^2} \leftarrow 625$$
← 625a, 625b, 625c

PLL.SPE PLL.SPE_USER_SPEC ← 626

OUTPUT FREQ:

PLL.OUTPUT_FREQ = VCO.OUPUT_FREQ ← 627

PLL.OUTPUT_FREQ = PLL.OUPUT_FREQ_MAX_USER_SPEC ← 628

PLL.OUTPUT_FREQ = PLL.OUPUT_FREQ_MIN_USER_SPEC ← 629

$$\text{DIV.M} = \frac{\text{PLL.INPUT\_REF\_SIGNAL\_FREQ}}{\text{PLL.OUPUT\_FREQ}} \leftarrow 630$$

PLL SYSTEM
LEVEL EQUATIONS
600A

PLL SYSTEM LEVEL EQUATIONS 600A

STABILITY
$$\text{PLL.CROSS\_OVER\_FREQ} = \frac{\text{LF.R(PFD.GAIN)(CP.IP)(VCD.GAIN)}}{\text{DIV.M}} \quad \leftarrow 631$$

$$\text{PLL.PHASE\_MARGIN} = \left\{ \begin{array}{l} /2 - \text{PLL.CROSS\_OVER\_FREQ (LF.R)(LF.C2)} \\ - \text{PLL.CROSS\_OVER\_FREQ (VCO.TAV3)} \end{array} \right\} \quad \leftarrow 632$$

PLL.CROSS_OVER_FREQ   PLL.CROSS_OVER_FREQ_USER_SPEC ← 633
PLL.PHASE_MARGIN   PLL.PHASE_MARGIN_USER_SPEC ← 634

PEAK JITTER
$$\text{PLL.PEAK\_JITTER} = \frac{\text{VCO.KAPPA}(2)^{0.5}(\text{DIV.M})^{0.5}(\text{LF.C1})^{0.5}}{(\text{PFD.GAIN})^{0.5}(\text{CP.IP})^{0.5}(\text{VCO.GAIN})^{0.5}} \quad \leftarrow 635a$$

$$+ \frac{3\{\text{SIA}[(\text{SEC.TRESET})(\text{PLL.INPUT\_REF\_SIGNAL\_FREQ})(\text{CP.DELTA\_IP})]\text{ICO.GAIN})(\text{LF.R}) \propto (\text{LF.R})(\text{LF.C2})\ 2\ (\text{PLL.INPUT\_REF\_SIGNAL\_FREQ})?}{2(\text{PLL.INPUT\_REF\_SIGNAL\_FREQ})(\text{DIV.1})} \quad \leftarrow 636$$

635b, 635b1, 635

PLL.PEAK_JITTER   PLL.PEAK_JITTER_USER_SPEC

POWER SUPPLY REJECTION
PLL.VDD_DC = VCO.VDD_DC ← 637
PLL.VDD_DC   PLL.VDD_DC_USER_SPEC ← 638

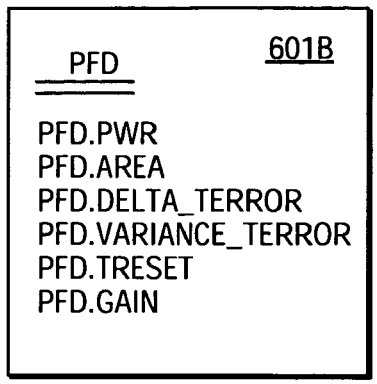
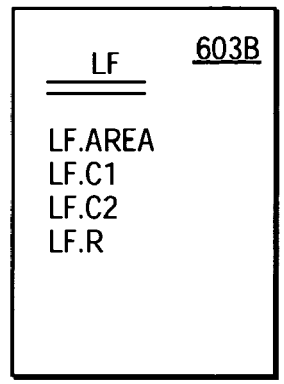
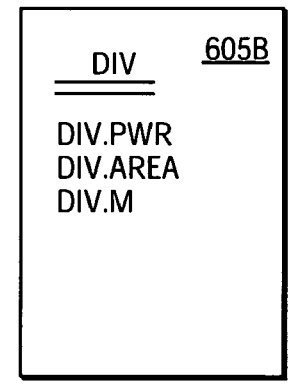
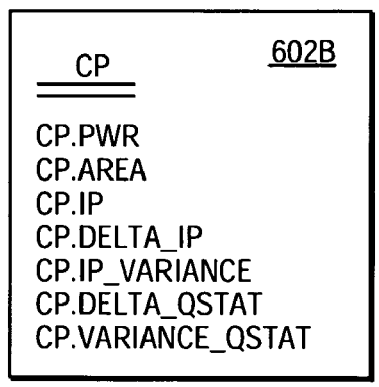
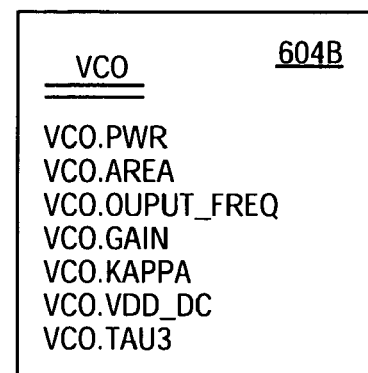
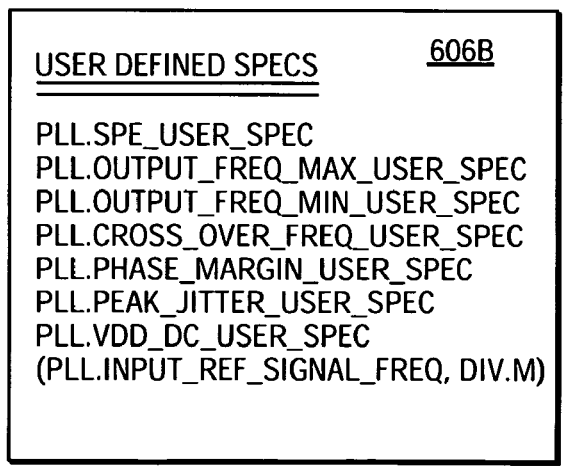
PLL SYSTEM
LEVEL VARIABLES
FIG. 6B

PFD

CP

LF

VCO

DIV

1 = PFD.VDD; CP.VDD; VCO.VDD; DIV.VDD

2 = PFD.GND; CP.GND; LF.GND; VCO.GND; DIV.GND

3 = PFD.IN_1

4 = PFD.OUT_UP; CP.IN_UP

5 = PFD.OUT_DOWN; CP.IN_DOWN

6 = CP.OUT; LF.IN

7 = LF.OUT; VCO.IN

8 = VCO.OUT; DIV.IN

9 = DIV.OUT; PFD.IN_2

PLL SYSTEM LEVEL EQUATIONS 600F

STABILITY
$$\text{PLL.CROSS\_OVER\_FREQ} = \frac{\text{LFR(PFD.GAIN)(CP.IP)(VCO.GAIN)}}{\text{DIV.M}} \leftarrow 631$$

$$\text{PLL.PHASE\_MARGIN} = \Pi/2 - \frac{1}{\text{PLL.CROSS\_OVER\_FREQ (LFR)(LFC2)}} - \text{PLL.CROSS\_OVER\_FREQ (LFR)(LFC2)} - \text{PLL.CROSS\_OVER\_FREQ (VCO.TAU3)} \leftarrow 632$$

PLL.CROSS_OVER_FREQ ≤ PLL.CROSS_OVER_FREQ_USER_SPEC ← 633
PLL.PHASE_MARGIN ≥ PLL.PHASE_MARGIN_USER_SPEC ← 634

PEAK JITTER $$\text{PLL.PEAK\_JITTER} = \frac{\text{VCO.KAPPA }(2\Pi)^{0.5}\text{(DIV.M)}^{0.5}\text{(LFC1)}^{0.5}}{\text{(PFD.GAIN)}^{0.5}\text{(CP.IP)}^{0.5}\text{(VCO.GAIN)}^{0.5}} \leftarrow 635a$$

$$+ \frac{3\{\sin[\Pi(\text{SEC.TRESET})(\text{PLL.INPUT\_REF\_SIGNAL\_FREQ})](\text{CPDELTA\_IP})(\text{VCO.GAIN})(\text{LFR})\propto(\text{LFR})(\text{LFC2})\ 2\Pi\ (\text{PLL.INPUT\_REF\_SIGNAL\_FREQ})B}{\Pi^2\ (\text{PLL.INPUT\_REF\_SIGNAL\_FREQ})(\text{DIV.M})} \leftarrow 635b1$$

635b  }635

PLL.PEAK_JITTER ≤ PLL.PEAK_JITTER_USER_SPEC ← 636

POWER SUPPLY REJECTION
{ PLL.VDD_DC = VCO.VDD_DC ← 637
PLL.VDD_DC ≤ PLL.VDD_DC_USER_SPEC ← 638

FIG. 8A

802A $CP.PWR = [4M9.ID + MS.ID]\ V_{DD}$ ← 820

$CP.IP = MS.ID$ ← 821

$CP.DELTA\_IP = \left[\dfrac{M5.gd\ (MG.gd)}{M6.gm} + \dfrac{M7.gd\ (M8.gd)}{M8.gm}\right]\dfrac{V_{DD}}{2}$ ← 822

$CP.IP\_VARIANCE = (MS.ID)^2 \left(\dfrac{Z}{((M5.W)(M5.L)(M5.M))^{0.5}}\right)^2 + (M7.ID)^2 \left(\dfrac{Z}{((M7.W)(M7.L)(M7.M))^{0.5}}\right)^2 + \left\{\left(\dfrac{DELTA.VT}{((M5.W)(M5.L)(M5.NF))^{0.5}}\right)^2 \cdot \left(\dfrac{1}{M5\ gm}\right)^2 + \left(\dfrac{DELTA.VT}{((M7.W)(M7.L)(M7.NF))^{0.5}}\right)^2 \cdot \left(\dfrac{1}{M7\ gm}\right)^2\right\}_{823}$ $CP.DELTA\_QSTAT = \dfrac{V_{DD}}{Z\ OPAMP.GAIN} + OMPAMP.DELTA\_VIN + \left(\dfrac{M6.Cdb + M6.Cgd + 2M1.Cgs + 2M1.Cgd}{MB.Cdb + Mi.Cgd + 2M3.Cys + iM3.Cgd}\right)$ ← 824

$CP.VARIANCE\_QSTAT = \left[\left(\dfrac{M6.Cdb + M6.Cgd + 2M1.Cgs + 2M1.Cgd}{M8.Cdb + M8.Cgd + 2M3.Cgs + 2M3.Cgd}\right)\right]^2 OPAMP.VARIANCE\_VIN$ ← 825

$CP.AREA = B\left[W_5L_5 + W_{5a}L_{5a} + W_{5c}L_{5c} + W_6L_6 + W_{6a}L_{6a} + W_{6b}L_{6b} + W_{6c}L_{6c} + W_7L_7 + W_{7a}L_{7a} + W_{7b}L_{7b} + W_8L_8 + W_{8a}L_{8a} + W_{8b}L_{8b} + W_{8c}L_{8c} + W_1L_1 + W_2L_2 + W_3L_3 + W_4L_4 + W_9L_9 + W_{10}L_{10}\right]_{826}$
$+ OPAMP.AREA + Iref.AREA$ $$\text{VCO.PWR} = (M21.ID + N(Mx.ID))V_{DD} + \text{OPAMP.PWR} \quad \leftarrow 920$$

$$\text{VCO.AREA} + \text{OPAMP.AREA} + W_{21}L_{21} + W_{22}L_{22} + W_{24}L_{24} + W_{25}L_{25} + \sum_{a=1}^{N} W_{ap}L_{ap} + \sum_{a=1}^{r} W_{an}L_{an} + \sum_{a=1}^{N} W_{xa}L_{xa}$$

$$\text{VCO.GAW} = 1/2 \left[ \frac{M21.gm\,(NMx.W)}{M22.W} \right] \left[ \frac{(Mn+Mp)^{0.5}}{((Mn.ID)(Cnx(1+\text{ratio}))(Mn.W)N)^{0.5}(2Mn.L)^{1.5}} \right] \quad \leftarrow 922$$

$$\text{VCO.KAPPA} = \frac{\sqrt{z(Mn.W)}}{2 \cdot 6^{n.5}\,(n.75)\,N^{1.5}(Mp.W)(Mn.Cqs)(\text{VCO.OUPUT\_FREQ})} \cdot \frac{4Nk^2T?\,[Mn.gm + Mp.gm]}{10[Mn.J]^{0.25}\,[Mn.L]^{0.25}\,[Mn.ID]^{0.25}} \cdot \frac{\left[1 + \dfrac{M22.gd}{M22.gm}\right]}{\left[\dfrac{1+N}{r_C} + N\,[M21.gd + M22.gd]\right] \text{OPAMP.GAIN}} \quad \leftarrow 923, 924$$

$$\text{VCO.VDD\_DC} = \frac{(Mn+Mp)^{0.5}}{((Mn.ID)(Cnx(1+\text{ratio}))(Mn.W)N)^{0.5}(2L)^{1.5}}$$

$$\text{VCO.TAU3} = \frac{(M24.CGS)(M22.GM)}{(\text{OPAMP.CM\_1>})(M22.GD)} \quad \leftarrow 925$$

FIG. 9A

CURRENT $926 \left\{ \begin{array}{l} M21.ID = M22.ID \\ M24.L = M22.L \end{array} \right.$ $927 \left\{ \begin{array}{l} M22.V60V = Mx.V60V \\ M22.L = Mx.L \end{array} \right.$ $928 \left\{ \begin{array}{l} Mn.L = Mp.L \\ Mp.W = (ratio)\ Mn.W \end{array} \right.$

VOLTAGE $929 \longrightarrow M22.V60V < V_{DD} - \dfrac{10(Mn.ID)^{0.25}\ (Mn.ID)^{0.25}}{(Mn.W)^{0.25}} - k$ $930 \longrightarrow M21.V60V < \dfrac{10(Mn.L)^{0.25}\ (Nn.ID)^{0.25}}{(Mn.W)^{0.25}} - k$

FIG. 9B

SYSTEM LEVEL: PLL.PWR = PFD.PWR + CP.PWR + VCO.PWR + DIV.PWR

AFTER SUBSTITUTION OF LOWER LEVEL
INFORMATION FOR
CP.PWR & VCO.POWER:

PLL.PWR = PFD.PWR + [4M9.ID + M5.ID] $V_{DD}$ + M21.ID + N(Mx.ID) $V_{DD}$ + OPAMP.PWR

PFD

CP

VCO

DIV

R

C1

C2

1 = PFD.VDD; CP.VDD; VCO.VDD; DIV.VDD

2 = PFD.GND; CP.GND; C1.2; C2.2; VCO.GND; DIV.GND

3 = PFD.IN_1

4 = PFD.OUT_UP; CP.IN_UP

5 = PFD.OUT_DOWN; CP.IN_DOWN

6 = CP.OUT; C2.1; R.1; VCO.IN

7 = R.2; C1.1

8 = VCO.OUT; DIV.IN

9 = DIV.OUT; PFD.IN_2

AUTOMATIC PHASE LOCK LOOP DESIGN USING GEOMETRIC PROGRAMMING

RELATED APPLICATION

This application is a continuation of the prior application for "Automatic Phase Lock Loop Design Using Geometric Programming" filed by David M. Colleran et al. on Apr. 7, 2002 (U.S. patent application Ser. No. 10/119,347) now U.S. Pat. No. 6,909,330.

FIELD OF INVENTION

The field of invention relates generally to circuit design; and, more specifically, to automatic phase lock loop design using geometric programming.

BACKGROUND 1.0 Phase Lock Loop (PLL) Theory of Operation

FIG. 1 provides an illustration of a Phase-Lock-Loop (PLL) 100. As seen in FIG. 1, a typical PLL includes a phase detector 101, a charge pump 102, a loop filter 103, a Voltage Controlled Oscillator (VCO) 104 and a feedback divider 105. PLLs are often used for frequency multiplication, wherein, the frequency of an input reference signal 106 is effectively multiplied. That is, the output signal 107 frequency of the PLL 100 (which corresponds to the output signal 107 frequency of the VCO 104) will be a multiple of the frequency of the input reference signal 106. According to basic principles of PLL operation, the multiplication is coextensive with the frequency division "M" performed by feedback divider 105.

Better said, if the feedback divider 105 reduces the frequency of the VCO output signal 107 by a factor of M, the frequency of the VCO output signal 107 should be a factor M of the reference signal 106 frequency. A working PLL 100 may be thought of as a stable control system that is designed to "automatically" drive an error term magnitude to zero. Here, the error term magnitude can be thought of as effectively representing the difference between the actual VCO output signal 107 frequency and the correct VCO output signal 107 frequency. In reality, the error term magnitude represents the difference between the actual VCO output signal 107 phase and the correct VCO output signal 107 phase. The correct VCO output signal 107 frequency, as discussed above, corresponds to MfREF where M is the frequency division performed by the feedback divider 105 and fREF is the input reference signal 106 frequency.

Thus, when the VCO output signal 107 frequency deviates from MfREF, a non zero error term magnitude is created that causes the VCO output signal 107 frequency to change in a direction that corrects for the error. Notice that the error term may also be described as having a polarity (e.g., positive or negative) so that the appropriate direction of VCO output signal 107 frequency change is represented. For example, if the VCO output signal 107 frequency is less than MfREF (i.e., the VCO output signal 107 frequency is too low), a positive error term is created that causes the VCO output signal 107 frequency to increase. Likewise, if the VCO output signal 107 frequency is greater than MfREF (i.e., the VCO output signal 107 frequency is too high), a negative error term is created that causes the VCO output signal 107 frequency to decrease.

The polarity of the error term is a matter of definition and may be "flipped" from that described just above depending on the particular definitional preference of the designer (i.e., some designs may choose to define a negative error term as corresponding to a situation where the VCO output signal is too low and a positive error term as corresponding to a situation where the VCO output signal is too high). For convenience, the terminology initially described above (wherein a positive error term causes a VCO output signal 107 frequency increase and a negative error term causes a VCO output signal 107 frequency decrease) will be used throughout the present application.

Referring to the PLL topology 100 of FIG. 1, the error term is presented at the output of the phase detector 101. As such, in order to effectively compare the "actual" VCO output signal 107 frequency against the "correct" VCO output signal 107 frequency (so that an appropriate error term may be crafted), notice that the phase detector 101 receives both the input reference signal 106 and the output signal 108 of the feedback divider 105. With a correct VCO output signal frequency corresponding to MfREF; and, with the feedback divider 105 dividing down the frequency of the VCO output signal 107 by a factor of M; note that, when the frequency of the VCO output signal 107 is correct (i.e., is equal to MfREF), the frequency of the input reference signal 106 (i.e., fREF) and the frequency of the frequency divider output signal 108 should be the same (i.e., the frequency of the feedback divider output signal 108 should also be fREF).

Likewise, deviations of the VCO output signal 107 frequency away from its correct value (MfREF) would cause the frequency of the feedback divider output signal 108 to correspondingly deviate from a frequency of fREF. As such, the phase detector 101 effectively uses the input reference signal 106 frequency as a "benchmark" against which the frequency of the feedback divider output signal 108 is compared. The comparison results in an error term being crafted having both magnitude information (which expresses the extent to which the pair of frequencies are dissimilar) and polarity information (which expresses which signal has greater frequency). When the frequencies are the same, the error term should have a magnitude of zero (meaning no change in VCO output signal 108 frequency is needed); and, when the frequencies are different, the error term should have a magnitude that is representative of the amount of difference as well as a polarity that indicates whether or not the feedback divider output signal 108 frequency is less than or greater than fREF.

The phase detector 101 is typically designed to effectively compare the frequencies of its input signals 106, 108 in the time domain rather than the frequency domain; and, as such, compares the phase positioning of signals 106, 108 (hence the name "phase" detector). Here, as depicted at the inset 109 of FIG. 1, if the phase detector 101 observes that an edge of the feedback divider output signal 108 is "lagging" an edge of the input reference signal 106, the phase detector will craft a positive error term (indicating that the VCO output signal 107 frequency is too low); and, likewise, as observed at inset 110, if the phase detector 101 observes that an edge of the feedback divider output signal 108 is "leading" 111 an edge of the input reference signal 106, the phase detector will craft a negative error term (indicating the VCO output signal 107 frequency is too high).

In either case, the magnitude of the error term will indicate the extent to which the edges being compared are misaligned in time. If the VCO output signal frequency and phase are "correct", the edges should be aligned in time (as indicated at inset 111) which corresponds to an error term having zero magnitude. Note that the particular phase detector 101 embodiment of FIG. 1 uses different outputs to indicate error term polarity. That is, if the error term polarity is positive (so as to cause an increase in VCO output signal 107 frequency), a pulse will appear at a first output 112 ("up"); and, if the error term polarity is negative (so as to cause a decrease in VCO output signal 107 frequency), a pulse will appear at a second output 113 ("down"). In either case, the width of the pulse in time reflects the magnitude of the error term.

The PLL 100 is configured such that, after an initial period of time, the PLL will automatically acquire "phase lock" as depicted in depiction 111. This effectively corresponds to the PLL automatically driving the error term magnitude to zero (which also corresponds in kind to the VCO output signal 107 frequency being driven to a value of MfREF) over this same initial time period. The error term magnitude is automatically driven to zero because of the activity of the charge pump 102, loop filter 103 and VCO 104. A VCO 104 is a circuit that produces, at its output, a signal 107 whose frequency is a function of the voltage placed at its input 114. The charge pump 102 and loop filter 103 effectively cause a change in the voltage level of VCO input 114, where the voltage change is related to the error term information. That is, the size of the voltage change (e.g., in volts) is related to the magnitude of the error term and the direction of the voltage change (e.g., up or down) is related to the polarity of the error term.

As the loop filter 103 is comprised of a capacitor that is shunted to ground, the voltage level of the VCO input 114 can be increased by pumping charge into the loop filter 103; and, the voltage level of the VCO input 114 can be decreased by extracting charge from the loop filter 103. The charge pump 102 serves this function as it is configured to: 1) pump charge into the loop filter 103 so as to raise the VCO input 114 voltage (e.g., in response to a positive error term); and, 2) extract charge from the loop filter 103 so as to lower the VCO input 114 voltage (e.g., in response to a negative error term). The amount of charge pumped into or extracted from the loop filter 103 is proportional to the magnitude of the error term (so that the voltage change is proportional to the magnitude of the error term).

The loop filter 103 "holds" the voltage level of the VCO input 114 to that which the charge pump 102 changed it to. Here, a voltage change that causes the VCO output signal 107 frequency to be more accurate (i.e., closer to MfREF) should cause a subsequent error term to have less magnitude; while, a voltage change that causes the VCO output signal 107 frequency to be less accurate (i.e., farther from MfREF) should cause a subsequent error term to have greater magnitude. Thus, the more accurate the VCO output signal 107 frequency becomes, the less the voltage level at the VCO input 114 will be changed. This activity causes the PLL 100 to naturally guide its VCO input 114 voltage level to a voltage that corresponds to the correct VCO output signal 107 frequency. This, in turn, corresponds to the error magnitude term being automatically driven to zero.

2.0 Phase Lock Loop Characteristics

The previous discussion provided an overview of a theory of operation for a PLL. PLLs are typically constructed with electronic circuit components (e.g., transistors, capacitors, resistors, etc.) that have limited performance and/or performance characteristics that may vary as a function of manufacturing tolerances and/or environmental conditions. As such, when actually implemented in hardware, a PLL may stray from its perfect theoretical operation or otherwise possess imperfections that can affect other circuitry that depends on the operation of the PLL. Furthermore, the dynamics of "loop stability" (i.e., wherein an error term magnitude is automatically driven to zero) are more complicated than that described in the preceding section to the extent some additional "conditions" apply to the PLL's basic building blocks 101, 102, 103, 104, 105. As such, various performance characteristics are understood to exist for PLLs that help describe the imperfections and/or help identify whether or not the PLL will be stable over the region of desired operation. Some of these include (among possible others): 1) static phase error; 2) stability; and 3) jitter. A discussion of each of these is provided immediately below.

2.1 Static Phase Error

From the discussion of Section 1.0 (and in particular to the discussion of phase lock described with respect to inset 112 of FIG. 1), recall that a PLL should normally adjust the VCO output signal 107 frequency until the edges of the reference input signal 106 and the feedback divider output signal 108 are aligned with one another. By contrast, FIG. 2A shows a depiction of the static phase error that may exist within a PLL. From the depiction of FIG. 2A it is evident that static phase error corresponds to the tendency of a PLL to lock onto a misaligned relationship between the reference input signal 206 and the feedback divider output signal 208.

Typically, when a PLL exhibits static phase error, it is because of imperfections in the phase detector 101 and charge pump 102 that "effectively" cause a mis-aligned reference input signal 206/feedback divider output signal 208 condition (e.g., as depicted in FIG. 2A) to produce an error term having zero magnitude (i.e., no error term) from the perspective of the VCO input 114. Likewise, a properly aligned reference input signal/feedback divider output signal condition (e.g., as depicted at inset 111 of FIG. 1), "effectively" causes an error term having non zero magnitude from the perspective of the VCO input 114. This, in turn, corresponds to the VCO output signal 107 phase being misaligned from the phase of the correct value (Mfref), even though the VCO output signal 107 frequency is the correct value (Mfref).

2.2 Stability

Stability is a term of art used to refer to a pair of characteristics that can be used to describe whether or not a PLL will automatically drive the error term magnitude to zero (so as to produce the correct VCO output signal frequency). In general, the stability of a PLL depends upon whether or not it is behaving as a negative feedback loop. The PLL theory of operation provided in Section 1.0 effectively described negative feedback because (as described in Section 1.0): 1) if the frequency of the VCO output signal 107 was greater than its "correct" value of MfREF, the PLL acted to reduce the VCO output signal 107 frequency; and 2) if the frequency of the VCO output signal 107 was less than its "correct" value of MfREF, the PLL acted to increase the VCO output signal 107 frequency.

If the PLL were to operate inapposite to that described just above (i.e., if the VCO output signal frequency was increased in response to the phase detector's determining that the VCO output signal was above its correct output frequency; and/or, if the VCO output signal frequency was decreased in response to the phase detector's determining that the VCO output signal was beneath its correct output frequency), the PLL would be unstable because the VCO output signal frequency would tend to continually rise or tend to continually fall. Typically, the PLL parameters of "cross-over-frequency" and "phase margin" are used to help understand whether the PLL is operating within the realm of negative feedback.

A depiction of the cross over frequency 210 and phase margin 211 are shown in FIG. 2B. The cross over frequency is the frequency at which the transfer function 212 of the PLL reaches unity. Here, as the loop filter 103 is a low pass filter, the PLL channel (which can be viewed as the signal processing that occurs through one pass through the loop of the PLL) has a response that varies with frequency as depicted in transfer function 212. The phase margin 211 of the PLL is the difference between the phase delay through the PLL channel and 180 degrees at the cross over frequency 210. An example of the difference between the phase delay and 180 degrees of the PLL channel is observed in curve 213 of FIG. 2B. Here, the more the phase margin rises above −180 degrees, the more the PLL is operating within a negative feedback (and therefore stable) region of operation.

2.3 Jitter

Jitter relates to the variation in the period of the VCO output signal 107 with respect to an ideal output signal, Mfref, once phase lock has been acquired. Because of systematic variations at the VCO input 114, as shown in FIG. 2C, as well as random variations (due to thermal noise, for example), the instantaneous frequency at the VCO output signal 107 will not always be equal to Mfref, even though the average VCO output signal 107 frequency is correct. This will cause the time at which the rising edge of the VCO output signal 107 occurs to vary with respect to where the rising edge of Mfref would ideally occur. The maximum variation of the rising edges is undesirable, and is called jitter.

3.0 Lack of Widely Accepted Automated Analog and/or Mixed Signal Design Technology Digital signal processing "reacts" to an input signal depending on whether the input signal is recognized as a "1" or a "0". Likewise, digital signal processing generates an output signal from the perspective that the output signal corresponds to a "1" or a "0". Analog signal processing, by contrast, views an input signal as being continuous (rather than discrete "1"s or "0"s); and, on the output side, tailors a continuous output signal (as opposed to discrete "1"s or "0"s). When both analog and digital signal processing techniques are significantly involved in the overall function of an electronic circuit, the electronic circuit may be referred to as a "mixed signal" circuit.

That is, mixed signal refers to the notion that both digital signal processing and analog signal processing are being performed with the same circuit. As such, mixed signal circuitry and analog circuitry are both configured to process analog signals (and, likewise, contain some degree of analog circuitry). Here, PLLs are often characterized as mixed signal or analog. The charge pump 102, loop filter 103 and VCO 104 are regarded as analog building blocks while the feedback divider 105 and phase detector 101 are regarded as being either digital or analog building blocks. Unfortunately, the design of analog and (at least the analog portion of) mixed signal circuit design has traditionally involved manual, hand crafted techniques rather than automated techniques. Here, the manual, hand crafted approach to analog and mixed signal circuit design tends to slow down or otherwise complicate the circuit design flow process.

With semiconductor minimum feature sizes approaching 0.10 micron and below, highly integrated semiconductor chips are expected that will integrate significant amounts of both digital signal processing circuitry and analog signal processing circuitry onto the same semiconductor chip. Furthermore, with the growth of networking and handheld applications, analog signal processing has observed a surge in interest (because communication and handheld circuits tend to depend more upon analog/mixed signal functionality than those used for desktop or raised floor computing system applications).

As such, analog and mixed signal circuit design techniques have received widespread attention recently because of the relative scarcity of analog circuit designers (in light of the increased demand for analog and mixed signal circuit designs themselves) combined with the manual, hand crafted approach to analog and mixed signal circuit design. Better said, the combination of manual design techniques, a small supply of analog designers and the increased demand for analog and mixed signal circuit designs has threatened the ability of analog/mixed signal circuit design teams to meet demand in a timely fashion. PLLs, being regarded as one of the more commonly used analog or mixed signal circuits, therefore tend to complicate or extend the development strategy of the many semiconductor chips because of the manual, hand crafted approach to PLL circuit design.

LIST OF FIGURES

The present invention is illustrated by way of example and not limitation in the figures of the accompanying drawings, in which like references indicate similar elements and in which:

FIG. 1 shows an embodiment of a phase locked loop;
FIG. 2Aa shows an embodiment of static phase error;
FIG. 2B shows an illustration of stability;
FIG. 2C shows an example of systematic jitter;
FIG. 3A shows an embodiment of a netlist for an operational amplifer;
FIG. 3B shows an embodiment of a transistor level design for an operational amplifer;
FIG. 4A shows an example of a characterization of an op amp at the building block level of detail;
FIG. 4B shows an embodiment of an op amp at the building block level of detail;
FIG. 5A shows an embodiment of a methodology that may be used to develop a more detailed family of posynomial and monomial equations for a PLL;
FIG. 5B shows an embodiment of a methodology that may be used to generate more detailed circuit topology information for a PLL;
FIGS. 6 A and 6F show an embodiment of a system level family of equations for a PLL;
FIG. 6B shows an embodiment of the variables that are called out by the family of equations of FIGS. 6A and 6F;
FIG. 6C shows an embodiment of a circuit topology for a PLL;
FIG. 6D shows an embodiment of a netlist for the PLL topology of FIG. 6c;
FIG. 6E shows how a family of equations may expand if multiple operating points are described;
FIG. 7A shows equations for each of a phase detector, a loop filter and a feedback divider;
FIGS. 7B through 7D show circuit a topology for each of a phase detector, loop filter and feedback divider;
FIG. 8A shows a first set of equations for a charge pump;
FIG. 8B shows a second set of equations for a charge pump;
FIG. 8C shows a circuit topology for a charge pump;
FIG. 9A shows a first set of equations for a VCO;
FIG. 9B shows a second set of equations for a VCO;
FIG. 9C shows a circuit topology for a VCO;
FIG. 10 shows a methodology by which an automated design tool may operate according to;

FIG. 12 shows an example of the effects of making a substitution into a posynimial or monomial equation;

FIG. 13 shows an example of the effects of making a circuit topology substitution into a netlist;

DETAILED DESCRIPTION 1.0 Introduction

Figure 2A:
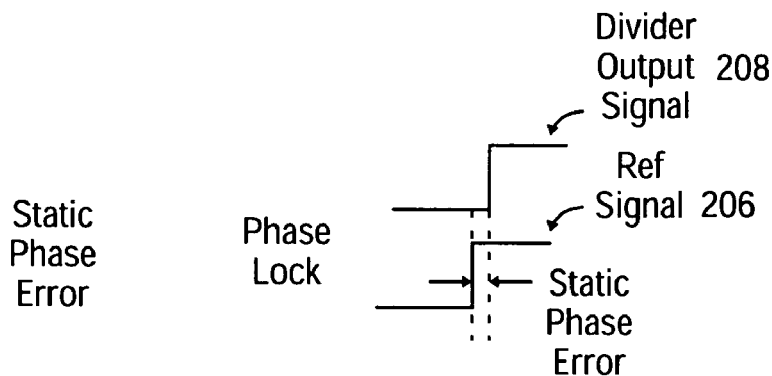
Figure 2B:
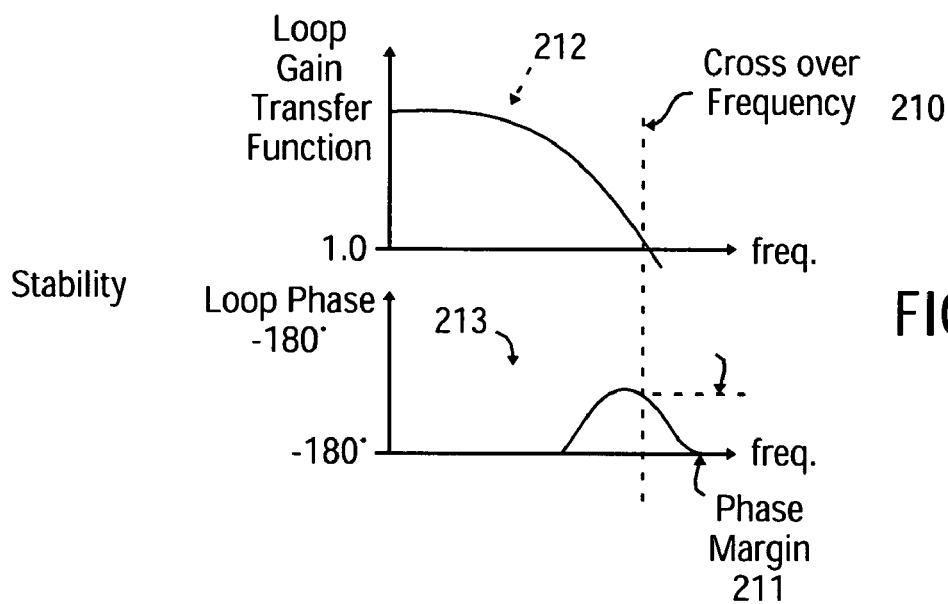
Figure 2C:
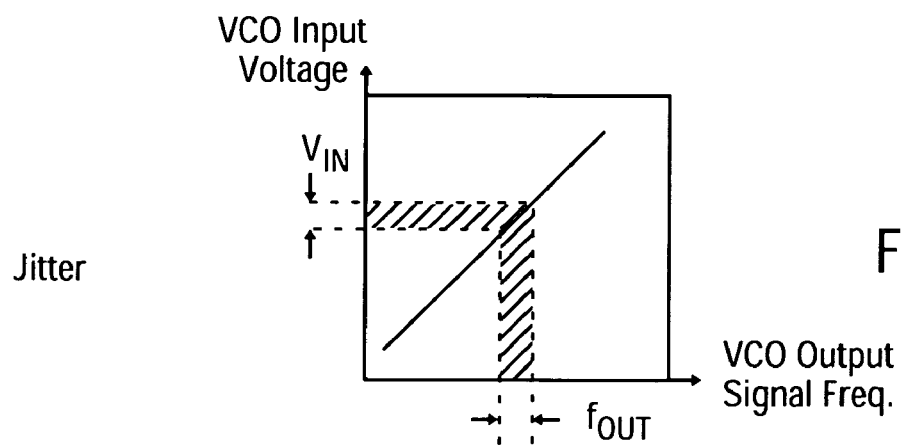

A solution to the problem of inefficient PLL signal circuit design is to automate the PLL circuit design process. Here, the ability to describe electronic circuitry at various levels of detail lends itself nicely to an automated circuit design process for a few reasons. Firstly, efficiency through automation is realized because a designer can adequately describe the PLL at a "high level" of detail. By allowing a designer to adequately describe the PLL at a high level of detail, the automated design process (rather than the designer) is left with the task of determining the more intricate details needed to prepare the PLL for manufacturing.

Here, the designer becomes more efficient because time that would have otherwise been devoted to determining the intricate details of the PLL design can be used, instead, to developing another high level description for another circuit design. Secondly, defining circuitry at various levels of detail makes the process flow of a software program that performs automated circuit design easier to define and construct. Better said, it is easier to develop a software program that is designed to automatically convert circuitry described at a first level of detail into circuitry described at a second level of detail (as opposed to an approach where various levels of detail are not appreciated). The following description discussed various techniques for an automated PLL circuit design process.

With respect to a PLL circuit design, completion of an automated circuit design process may be realized once a transistor level netlist has been formed. A transistor level netlist is a listing of the nodes (i.e., "nets") in a circuit to be manufactured; and, for each node, a specification of each of the components that are connected to that node (e.g., a transistor gate, a transistor source, a transistor drain, a first electrode of a capacitor, a second electrode of a capacitor, a first electrode of a resistor, a second electrode of a resistor, etc.). Netlists may also list the components themselves that are part of the circuit design (e.g., transistors, resistors, capacitors).

For each identified transistor, the netlist also specifies relevant transistor dimensions. For example, with respect to circuit designs targeted for a Complementary Metal-Oxide-Semiconductor (CMOS) field effect transistor manufacturing process, a transistor level netlist should define the gate length and gate width of each transistor. An example of a transistor level netlist 300 for an 8 transistor operational amplifier ("op-amp" or "op amp" or "opamp") is observed in FIG. 3a. The corresponding transistor level circuit design 350 of the op-amp to which the netlist 300 of FIG. 3a pertains is observed in FIG. 3b.

Note that a listing of each of the transistors M1 through M8 is provided in field 301 of the netlist 300; and, a listing of each of nodes 1 through 10 is observed in field 302 of the netlist. Note also that, for each of the transistors specified in field 301 of the netlist 300, the gate length and gate width have been specified. Furthermore, as seen in the exemplary netlist 300 of FIG. 3a, note that other specifics are provided for such as specific resistance values and capacitance values (which may alternatively be described in terms of their dimensions), etc. It is important to point that the netlist 300 observed in FIG. 3a (as well as those presented throughout the application) is an exemplary embodiment. As such, other netlists may be readily created by those of ordinary skill having different organization and/or format than that observed in FIG. 3a.

Figure 3B:
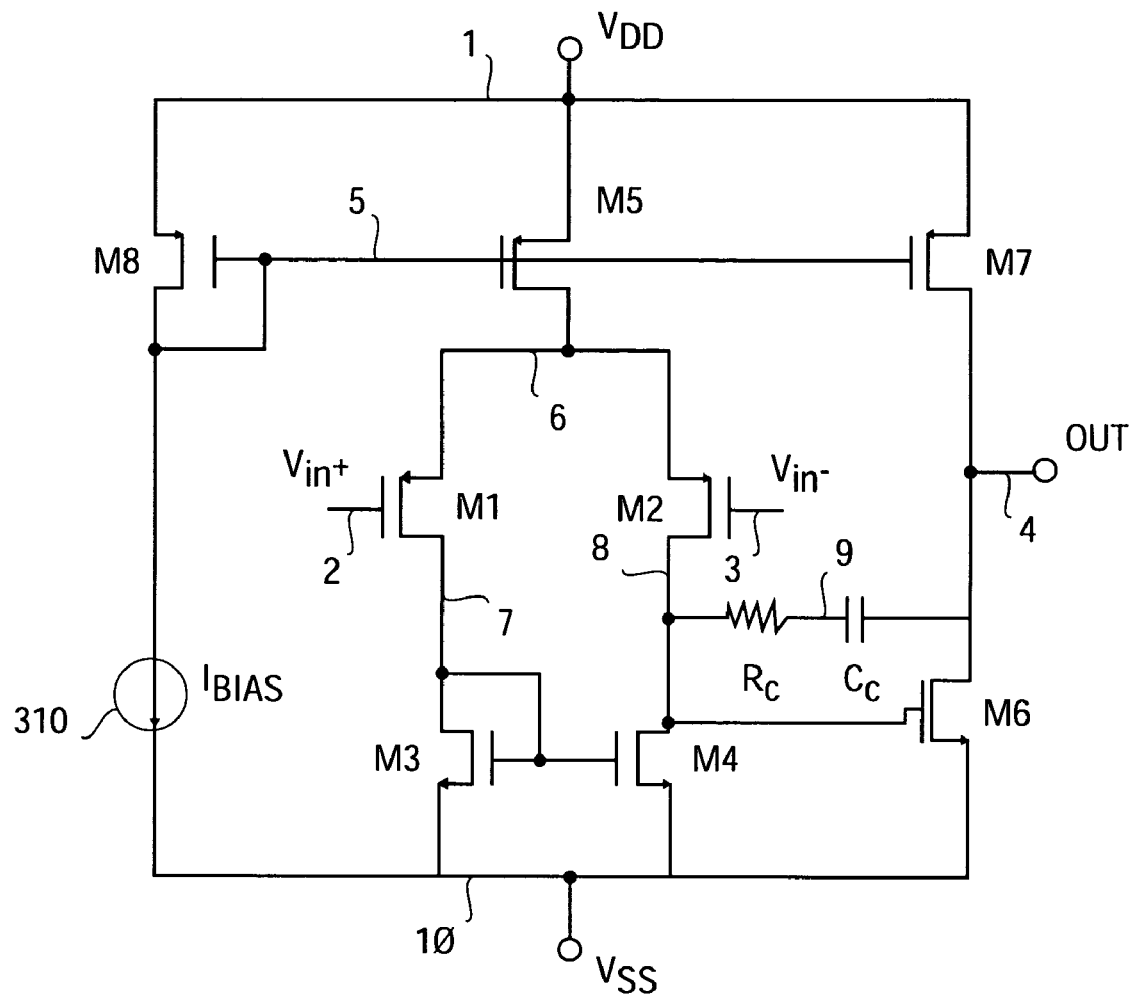

Heretofore, it has been appreciated that geometric programming can be used to rapidly define specific transistor dimensions (such as gate width and gate length) for a particular transistor level circuit design (such as the op-amp observed in FIG. 3b). For example, as described in U.S. Pat. No. 6,269,277B1 entitled "System and Method For Designing Integrated Circuits" and issued on Jul. 31, 2001, specific transistor dimensions (as well as specific resistance and capacitance values) can be automatically determined for an operational amplifier based upon designer articulated functional characteristics of the operational amplifier. For example, if a user desires the operational amplifier to have an open loop gain of CdB, a unity gain bandwidth of DMHz, a slew rate of E V/nsec (to list just a few of the functional characteristics for an op amp), a software program may be used to mathematically relate the functional characteristics of the operational amplifier to specific transistor dimensions (and resistance and capacitance values) through "geometric programming". As such, some degree of automated analog circuit design has been heretofore recognized.

However to the extent that geometric mathematics have already been identified as an underlying approach to automated analog circuit design; up to now, a "hierarchical" geometric approach has not been described or recognized. Here, a hierarchical geometric approach would allow specific transistor dimensions to be determined by "drilling down" through multiple levels of circuit description detail wherein each lower level adds more specific information about the circuit and wherein principles of geometric mathematics are preserved throughout each of the levels. Before describing such a system, a brief review of geometric programming will be provided so that the reader may understand relevant concepts relating to geometric programming.

2.0 Geometric Programming

Use of the term "geometric" in the present discussion refers to the use of equations that are expressed in monomial or posynomial form so that a geometric optimization problem can be constructed and/or solved in software. A monomial equation is an equation in the form of $$cx1\alpha1x2\alpha2 \ldots xn\alpha n \qquad \text{EQN. 1}$$

where x1 x2 ... xn are real, positive variables; c 0; and, αi is real. A posynomial equation is an equation in the form of $$\sum_{k=1}^{t} c_k x_1^{a_{1k}} x_1^{a_{2k}} \ldots x_n^{a_{nk}} \qquad \text{EQN. 2}$$

where x1 x2 ... xn are real, positive variables; ck 0; and, αi is real. An example of an equation expressed in monomial form is 2.3(x1/x2)1.5 (where c=2.3, α1=1.5, α1=−1.5); and, an example of an equation expressed in posynomial form is $0.7+3x1/x32+x20.3$ (where c1=0.7, $\alpha11=\alpha21=\alpha31=0$; c2=3, $\alpha12=1$, $\alpha22=0$, $\alpha32=-2$; c3=1, $\alpha13=0$, $\alpha23=0.3$, $\alpha33=0$).

Typically, a plurality of monomial and/or posynomial equations are collected or otherwise identified so that one of the equations can be "optimized" (e.g., maximized or minimized) so as to identify specific numeric values for the constituent variables associated with the equations used to construct and solve a geometric problem. For example, continuing with the example of the operational amplifier of FIGS. 3a and 3b, the power consumption, silicon surface area consumption, open loop gain, unity gain bandwidth, phase margin, and slew rate of the operational amplifier (as well as other functional characteristics of the operational amplifier) could each be described with a different monomial or posynomial equation.

As just one example of these, the open loop gain of the op amp could be expressed in monomial form as:

$$AO=KIBIAS(W2W6L7W8L5W8/L2L6W7L8W5L8)0.5 \quad \text{EQN. 3}$$

where: 1) K is a constant obtainable by those or ordinary skill; 2) IBIAS is the current drawn by the current source 310 of the op amp of FIG. 3b; 3) W is the gate width of the transistor that the applicable subscript identifies; and; 4) L is the gate length of the transistor that the applicable subscript identifies. Here, other monomial or posynomial equations that each express a specific op amp characteristic (such as those listed in the preceding paragraph (as well as others)) in terms of variables that correspond to transistor gate dimensions (or other parameters that can be converted into specific transistor dimensions as described in more detail below) can be "collected" so that the collection of equations represents a family of equations that, together, describe (in monomial and/or posynomial form) the operational amplifier as a whole.

Once a group of appropriate monomial equations and/or posynomial equations are collected, specific numeric values (i.e., "constraints") may be specified for the particular functional characteristic that each of the equations describe. In a common approach, one of the equations is not provided a specific numeric constraint so that it can be optimized (in respect of the numeric constraints applied to the other equations) through a geometric solving process. That is, in this case, the geometric problem may be constructed according to the following definition:

Minimize: monomial or posynomial equation_z      EQN. 4

Subject to: constrained form of monomial equation_1 constrained form of monomial equation_2

⋮ constrained form of monomial equation_X

AND constrained form of posynomial equation_1 constrained form of posynomial equation_2

⋮ constrained form of posynomial equation_Y

Here, the "family" of posynomial and monomial equations used to describe the circuit (such as the op amp referred to above) include equation z (which may be from the group of monomial equations in the family or from the group of posynomial equations in the family). As such, there are X+Y+1 total equations in the family of equations; one of which is to be optimized, the remainder of which are constrained.

As an example, if specific numeric "target" values (or ranges) are articulated for each of the op amp characteristics other than silicon surface area consumption (e.g., power 35 mW, open loop gain>106; unity gain bandwidth 100 MHz; phase margin>60°; slew rate 2.5 v/nsec), a geometric optimization problem can be constructed and solved wherein the solution corresponds to the minimum silicon surface consumption for the particular numeric constraints that were articulated. Better said, in the geometric problem model provided just above, the equation for silicon surface area consumption corresponds to "equation_z"; and, the remaining equations that describe the functional characteristics of the op amp correspond to the group of X+Y equations within the family that have been numerically constrained.

As such, if the equation for silicon surface area consumption is expressed in terms of specific transistor dimensions, the solution to the geometric problem (once the geometric problem is solved) will specify specific transistor dimensions that not only correspond to the minimum area of the op amp that may be achieved but also correspond to an op amp having the specific numeric constraints that were articulated. Before continuing, note that above cited geometric problem is just one type of geometric problem. For example, other geometric problems may choose to allow one or more equations (that take part in the problem solving process) to be unconstrained and neither maximized nor minimized. Generally, geometric problems are optimization problems that employ posynomial and/or monomial equations (that may be expressed in convex form or otherwise as explained in more detail below). The reader is referred to S. Boyd and L. Vandenberghe, "Introduction to Convex Optimization With Engineering Applications", Course Notes, 1999, http://www.leland.stanford.edu/class/ee364 for more details regarding the various forms by which an optimization problem may be expressed in geometric form.

Regardless as to the specific form in which a geometric optimization problem is stated, note that the manner in which that form is obtained (e.g., the techniques or strategies used to develop a family of specific monomial and/or posynomial expressions) may be widely varied. For example, note that the IBIAS term that appeared above in the (monomial) expression for open loop gain (EQN. 3 may be further expressed in monomial or posynomial form in terms of the dimensions of its constituent transistors (which have been obviated from FIG. 3b for simplicity).

As such, such an expression for IBIAS could be: 1) directly substituted into EQN. 3 (so as to form an expression for open loop gain "completely" in terms of a constant and transistor dimensions); 2) "kept apart" as a separate equation that is included with the family of equations that take part in the geometric problem solving process (e.g., is one of the X+Y equations illustrated in EQN. 4); or, 3) "kept apart" as a separate equation that is not included with the family of equations that take part in the geometric problem solving process (e.g., is not one of the X+Y equations illustrated in EQN. 4).

In the former (first) case, the "variables" of the geometric optimization process (at least with respect to open loop gain) are limited to transistor dimensions as expressed in a single equation. In the middle (second) case, the "variables" of the geometric optimization process (at least with respect to open loop gain) are limited to transistor dimensions as expressed via a pair of equations (e.g., one for open loop gain and one for bias current). In the later (third) case, the "variables" of the geometric optimization process (at least with respect to open loop gain) include not only transistor dimensions but also the bias current IBIAS of the op amp current source.

In the later case, once an optimal value for IBIAS is obtained (e.g., as would naturally "fall out" as a result of a solution to a geometric problem where IBIAS was one of its variables), a separate following sequence (geometric or otherwise) could be used to determine specific transistor dimensions for those transistors used to construct the op amp current source 310. Thus, a complete description for the op amp could be obtained even if the posynomial and monomial equations that are used to construct a geometric problem are not expressed "solely" in terms of transistor dimensions. This feature may be taken advantage of, for example, in order to express performance characteristics in more traditional terms (e.g., where, in the case of op amps for example, important functional characteristics tend to be explained in terms of op amp bias current rather than the dimensions of the transistors that form the current source that provides the bias current).

The fact that the open loop gain of an op amp could be accounted for in a geometric programming environment by at least three different approaches has been mentioned above to bring to light some relevant properties regarding the application of geometric programming techniques to analog circuit design automation. Firstly, the specific organization as to which functional characteristics are expressed as a separate equation and/or which variables are chosen to take part in each equation (i.e., how each posynomial and monomial equation is particularly expressed) and/or which equations take part in a geometric problem solving sequence (and which equations simply "make use of" an optimization result) may vary from embodiment to embodiment.

As such, for any analog or mixed signal circuit design, an automated design tool may employ any of a vast number of different, mathematical "paths" or "threads" in order to achieve a specific end result (e.g., transistor gate dimensions for the transistors within the circuit). Here, the simple case of op amp open loop gain has illustrated three unique mathematical paths that could be used. As such, where specific mathematical equations (or specific sequence(s) of specific mathematical equations) have been presented in the present application (e.g., as an example of a process flow for an automated design tool), the claims that follow should not be automatically construed as being limited solely to these equations (or to the specific sequence(s) according to which they flow).

Secondly, a second property that was touched upon by the former (first) approach (by which open loop gain was expressed completely in terms of transistor dimensions by substituting an expression for IBIAS into EQN. 3) is that posynomial or monomial equations may be "substituted" into other posynomial or monomial equations such that the resultant equation preserves a posynomial or monomial form. For example, if the equation for IBIAS is expressed in monomial form, its substitution into EQN. 3 would cause the resultant expression for open loop gain to also be in monomial from (since EQN. 3 is expressed in monomial form). Similarly, the substation of a monomial expression into a variable of a posynomial expression allows the posynomial expression to remain in posynomial form; and, the substitution of a posynomial expression into a monomial expression causes the monomial expression to expand into a posynomial expression.

Before continuing to the next section, it is important to point out that (once a family of equations in monomial and/or posynomial form have been collected for a particular analog circuit) those of ordinary skill will be able to readily construct an appropriate geometric problem in software; and, furthermore create or use known methods to actually solve the geometric problem in software. For example, according to one type of approach referred to as the "convex" approach, logarithms of monomial and posynomial expressions (whose variables are expressed as exponentials) are used in order to convert the geometric optimization problem into convex form.

A convex optimization problem effectively optimizes a logarithmic function in light of a plurality of other, constrained logarithmic functions. Here, optimization problems expressed in convex form are numerically easier to compute for a digital computing system (e.g., a computer) that is tailored to solve the optimization problem (e.g., through the use of a software program). Accordingly, the term "geometric problem", "geometric optimization problem" and the like is meant to include geometric problems that have been formulated in convex form. Likewise, the term monomial is meant to include monomial equations that are in a format suitable for a convex optimization problem; and, the term posynomial is meant to include posynomial equations that are in a format suitable for a convex optimazation problem. Typical software approaches used to solve convex optimization problems include interior-point primal barrier methods, interior-point primal-dual methods, and infeasible primal-dual methods among others. For these or other details related to geometric programming, the reader is again referred to http://www.leland.stanford.edu/class/ee364/.

3.0 Hierarchical Approach to Geometric Programming Based Automated PLL Circuit Design

3.1 Basic Analog Building Block Level of Detail

Up to now, as alluded to above, known geometric problem solving techniques for automated analog circuit design have been limited to the transistor level. As such, geometric problem solving techniques for automated analog circuit design have been limited in application to defining transistor dimensions only for isolated, basic analog building blocks. A basic analog building block is an analog circuit (or mixed signal circuit) whose "next", lower level of detail (i.e., more specific level of detail) is a transistor level of detail when the analog circuit (or mixed signal circuit) is not represented at a transistor level of detail.

Figure 4B:
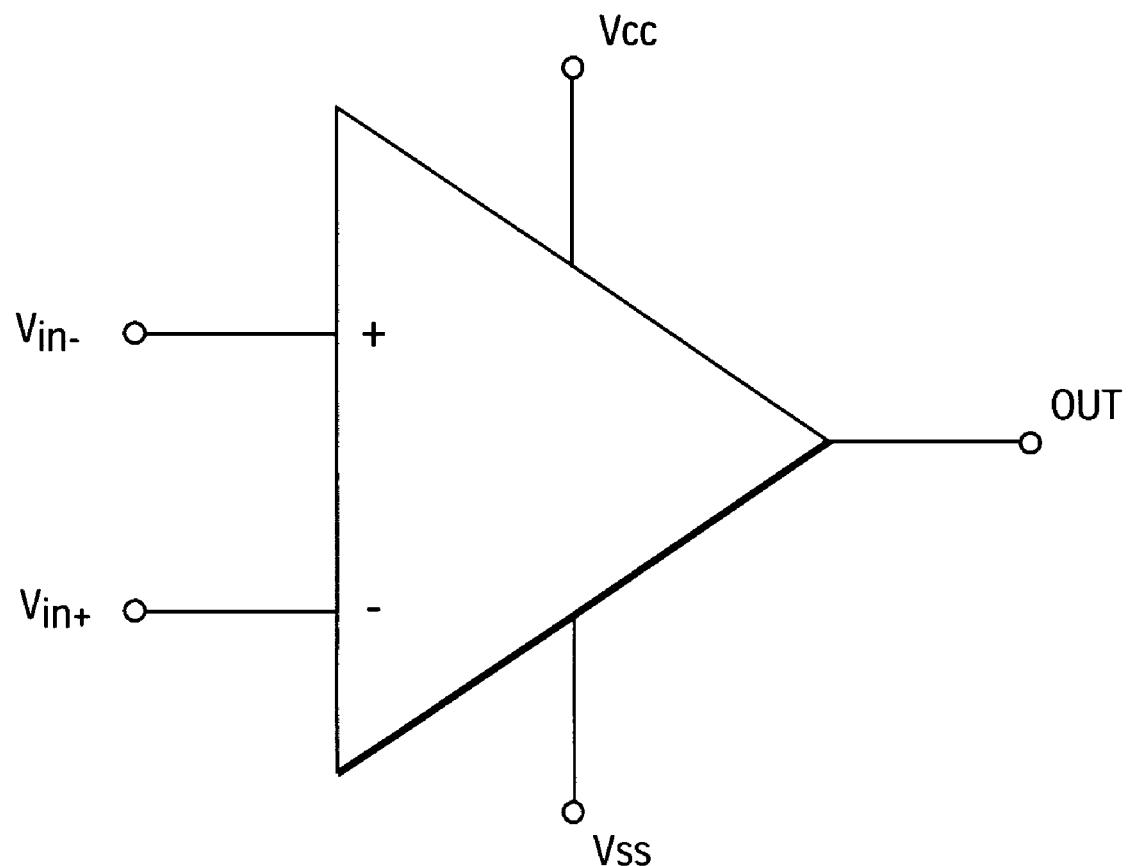

An embodiment of a basic, analog building block level of detail (or simply, "basic building block level of detail") for an operational amplifier is observed in FIGS. 4a and 4b. FIG. 4a shows an embodiment of a functional description articulated at the basic building block level of detail; and, FIG. 4b shows a circuit topology depiction for an opamp at the basic building block level of detail. Here, the opamp descriptions of FIGS. 3a and 3b may be compared with the opamp description of FIGS. 4a and 4b so as to form an understanding as to what is meant to by the term "basic building block" as described just above.

The operational amplifier depiction 450 of FIG. 4b is drawn as operational amplifiers are commonly drawn in a schematic drawing of a circuit that employs an operational amplifier. The characteristic description 400 of the operational amplifier 450 of FIG. 4b is observed in FIG. 4a. At the level of detail observed in FIG. 4b, with the exception of silicon surface area consumption, the description 400 of the operational amplifier 450 observed in FIG. 4a is limited to a listing of "functional" characteristics. Functional characteristics are electrical in nature rather than physical in nature. Thus, as seen in the example of FIG. 4*a*, the units of the characteristics listed therein are milliwatts (mW), decibels (dB), megahertz (MHz), degrees of phase, and Volts per nanosecond (V/nsec), etc.

Here, because the level of detail of the circuit topology 450 observed in FIG. 4*b* is devoid of transistor level information, the corresponding level of detail level to which the characteristics of the operational amplifier can be defined is correspondingly limited to levels of detail that are higher than the transistor level (such as the functional characteristics referred to above and observed in FIG. 4*a*). The next, lower level of detail to which the operational amplifier of FIGS. 4*a* and 4*b* can be described is the transistor level of detail observed in FIGS. 3*a* and 3*b*.

As discussed in the preceding section, the transistor level of detail includes transistor level information such as a circuit topology 350 that shows the individual transistors M1 through M8 used to construct the operational amplifier; and/or, a transistor level netlist 300 that not only describes the transistor level circuit topology 350 of FIG. 3*b*, but also includes specific dimensions for the transistors themselves. As such, whereas the level of detail associated with the description 400 of FIG. 4*a* describes the op amp largely in terms of its functional characteristics rather than its physical characteristics, note that the transistor level of detail describes the op amp largely in terms of its physical descriptions (e.g., specific nodes, their connections to particular transistor level components (such as resistors, capacitors and transistors) and the dimensions of these components) rather than its functional characteristics.

Because the next, lower level of detail of the description provided in FIGS. 4*a* and 4*b* is the transistor level (as observed in FIGS. 3*a* and 3*b*), the level of detail observed in FIGS. 4*a* and 4*b* correspond to a "basic building block". That is, because the next, higher level of detail above the transistor level of detail of FIGS. 3*a* and 3 is the level of detail observed in FIGS. 4*a* and 4*b*, the level of detail observed in FIGS. 4*a* and 4*b* is a "building block" level of detail. Here, referring back to FIG. 1, note that a PLL may be viewed as being constructed of five basic building blocks: 1) a phase detector 101; 2) a charge pump 102; 3) a loop filter 103; 4) a VCO 104; and, 5) a feedback divider 105.

Thus, to summarize, as is presently recognized in the prior art, geometric programming techniques have been used to automatically convert a description of an analog circuit at the basic building block level into a description at the transistor level of detail. Although this has commercial application, analog circuitry is often used, implemented and/or otherwise viewed at levels that are "higher" than the mere building block level. The PLL is an example wherein the PLL 100 is viewed as overall working system that is made up of its constituent building blocks 101 through 105.

PLLs may be described according to their output signal frequency range, static phase error, stability, jitter, etc. Note that, consistent with the concept of an analog system, these functional characteristics tend to describe properties of the overall PLL system that is formed by the coupling of various basic building blocks 101-105 as depicted in FIG. 1 (rather than describing the functional properties of a single building block by itself).

Figure 5A:
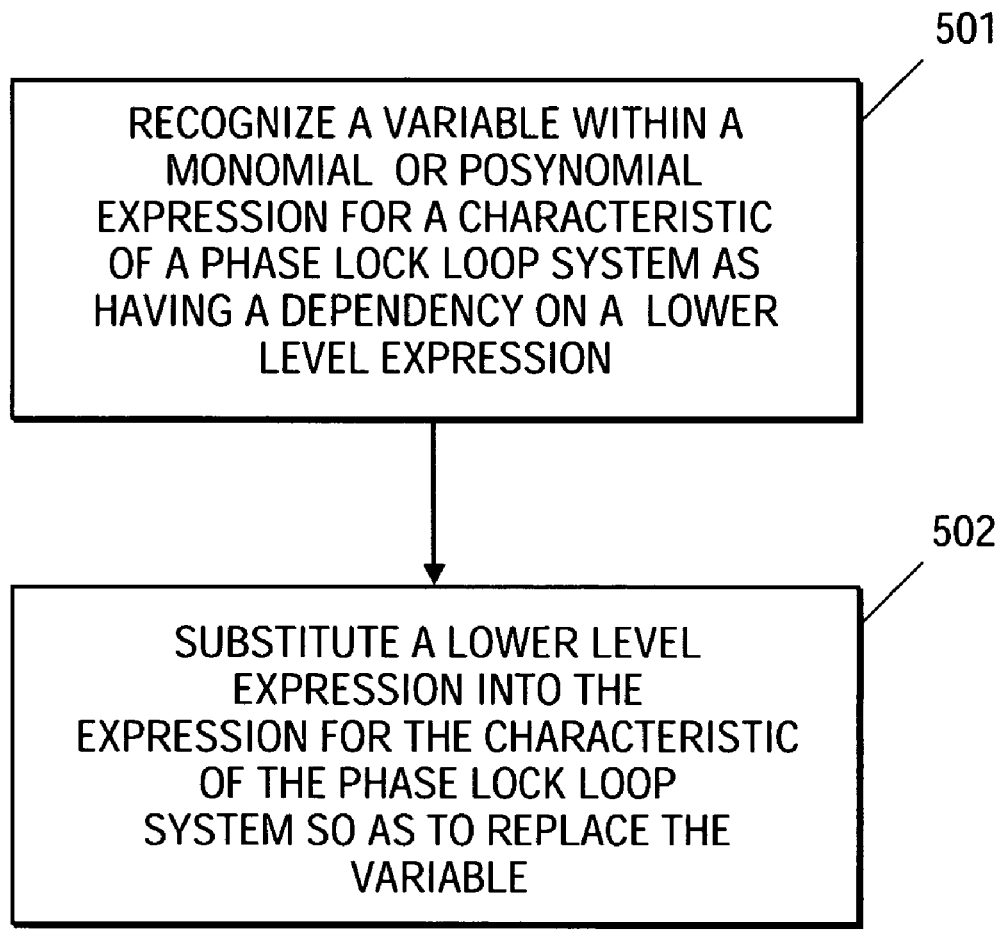

4.0 Methodologies For Automatically Developing A Transistor Level Information For A PLL From The System Level FIG. 5*a* shows a unit of operational flow 500 for a design tool that automatically develops a design for a PLL. According to the basic unit of operational flow observed in FIG. 5*a*, a variable within a posynomial or monomial expression for a characteristic of a PLL (e.g., static phase error, cross over frequency, phase margin, jitter, etc.) is recognized 501 as having a dependency on a lower level expression. Here, the dependency may be recognized (for example) because the variable is not expressed in terms of transistor level details or is otherwise identified as having information described at a level that is higher than the transistor level.

The term "dependency" is used to invoke the notion that, in order for the variable to be represented at the transistor level, more detailed information needs to gathered (e.g., by "drilling down" through multiple levels of detail). Once an system level variable of a PLL has been identified 501, a lower level monomial or posynomial expression for that variable is substituted 502 into the system level expression (so as to replace the "substituted for" variable within the system level expression). Substitutions may then be continually made until the original system level variable is expressed in transistor level terms.

Figure 5B:
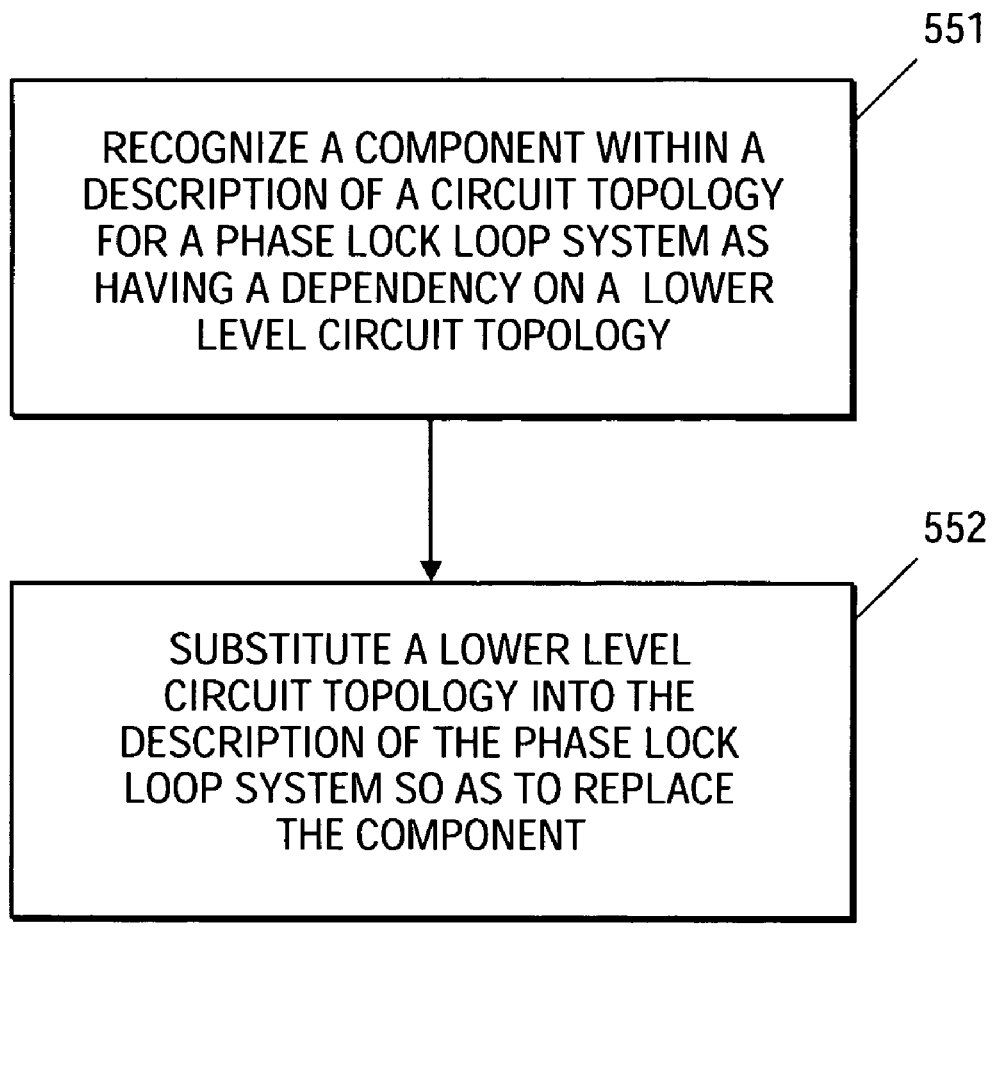

FIG. 5*b* shows another unit of operational flow 550 for a design tool that automatically develops a design for a PLL. A distinction between the methodology 500 of FIG. 5*a* and the methodology 550 of FIG. 5*b* is that the methodology 500 of FIG. 5*a* relates to the manipulation of posynomial and/or monomial equations; whereas, the methodology 550 of FIG. 5*b* relates to the manipulation of a netlist (or other circuit topology description) that describes the specific components and/or nodes of a circuit design. According to the basic unit of operational flow 550 observed in FIG. 5*b*, a component within the circuit topology of an analog or mixed signal system is recognized 551 as having a dependency on a lower level circuit component (e.g., a basic building block such as the VCO). Here, the dependency may be recognized (for example) because the circuit component is not expressed in terms of transistor level details or is otherwise identified as having information described at a level that is higher than the transistor level.

The term "dependency", again, is used in the above to invoke the notion that, in order for the component to be represented at the transistor level, more detailed information needs to gathered (e.g., by "drilling down" through multiple levels of detail). Once a component of a PLL system has been identified (e.g., the VCO) 551, a lower level description of that circuit component is substituted 552 into the system level circuit topology (so as to replace the "substituted for" component within the system level topology). Substitutions may then be continually made until the original system level component is expressed in transistor level terms.

The methodologies 500, 550 of FIGS. 5*a* and 5*b* may be executed in series or in parallel, alone or in combination in order to help develop multiple "paths" or "threads" of circuit description detail so that, eventually, a PLL is thoroughly described at a transistor level of detail. As described further detail below, the various threads may "branch out" from a common thread section and/or exhibit longer thread lengths than other thread lengths (signifying a greater number of substitutions having to be made to reach the transistor level of detail). Note also that, according to various possible approaches, either methodology 501 alone (dependent variable recognition) or methodology 551 alone (dependent component recognition) may be used to trigger the execution of both methodologies 502 (equation substitution) and 552 (component substitution). This follows naturally when one views circuit topology and functional/physical description as part of a complete description (noting that at the transistor level topology and description may become merged as discussed with respect to FIG. 3*a*).

5.0 Embodiment of a System Level Description for A PLL

5.1 Overview

Figure 6C:
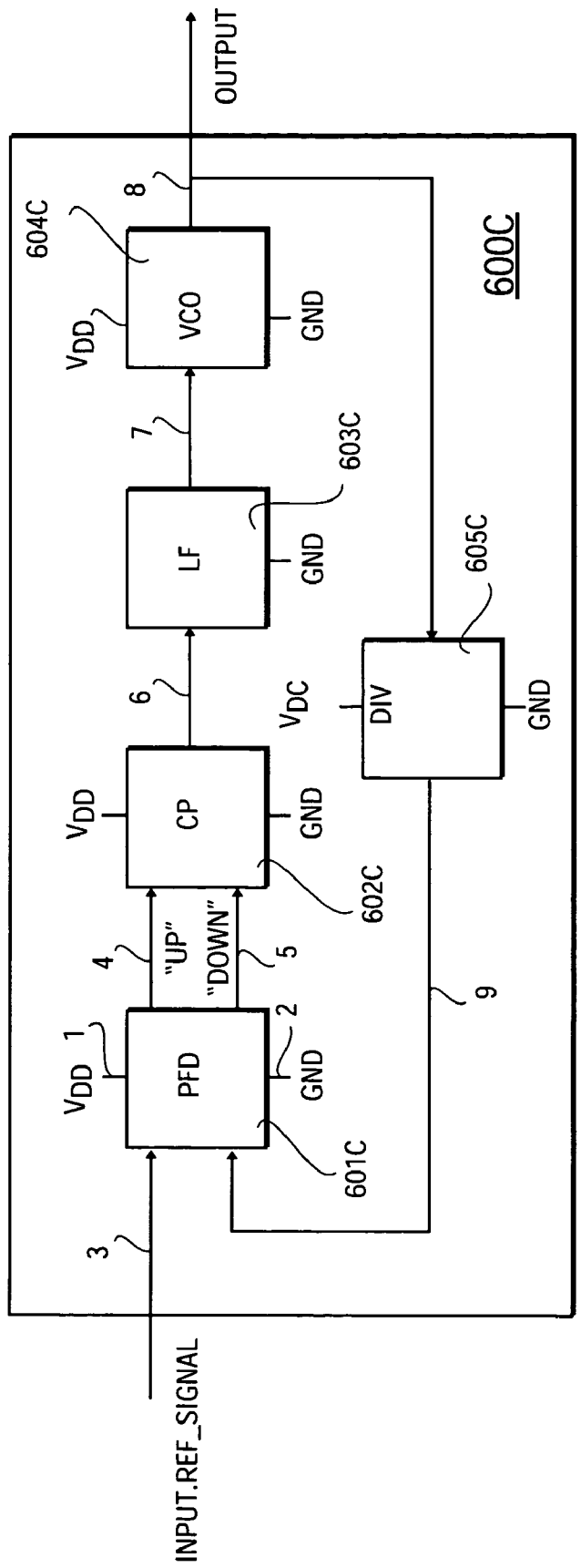

FIGS. 6a through 6f relate to an exemplary embodiment of a system level PLL description that can be "drilled down" to a transistor level of detail by employing the methodologies 500, 550 of FIGS. 5a and 5b. Specifically, as explained in more detail below, the system level description for the PLL may be made to include: 1) a family 600a of equations expressed in monomial or posynomial form (e.g., as seen in FIGS. 6a and 6f); and 2) a netlist 600d (e.g., as observed in FIG. 6d), or other circuit description that describes the topology 600c of a PLL (e.g., as seen in FIG. 6c). Note that the level of detail associated with the descriptions referred to just above corresponds to a system level of detail because the PLL is described (both in the equation family 600a and 600f and in the topology 600c) as a collection of basic building blocks (i.e., phase detector, charge pump, loop filter, VCO and frequency divider).

Figure 6E:
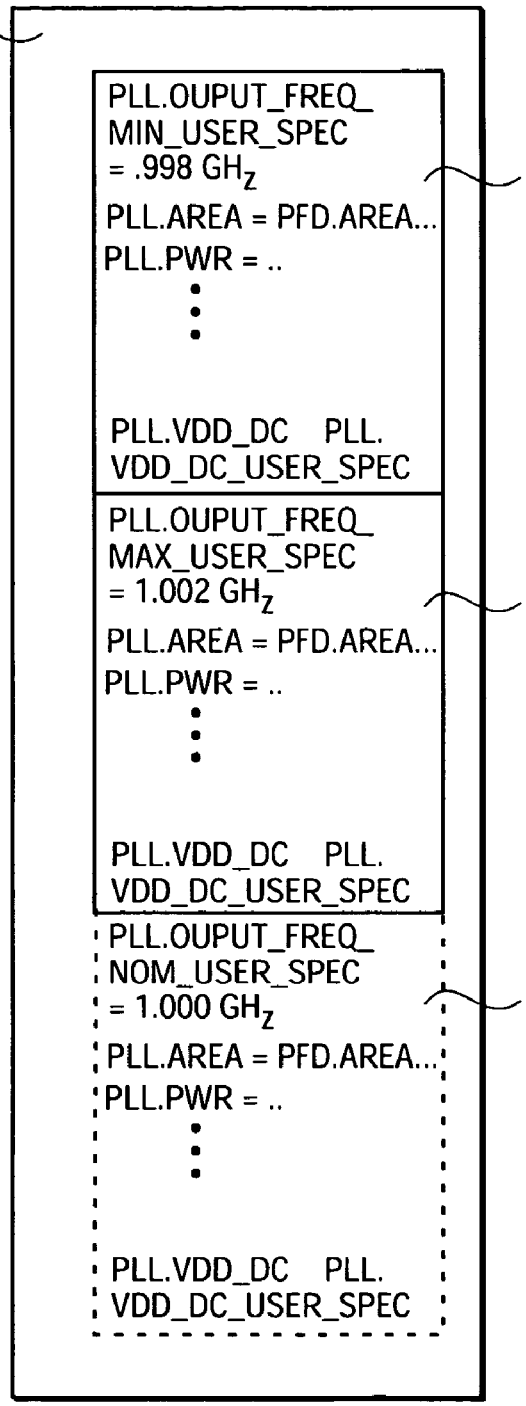

The effect(s) that the aforementioned drilling down activity will have, in terms of enabling the automatic incorporation of more detailed information into the description of the PLL, will become more apparent in the discussion that follows. FIGS. 6a and 6f show a representation of a family 600a and 600f of posynomial and monomial equations 621 through 629 and 631 through 638 that describe a PLL at the system level. FIG. 6b shows the collection of variables and user defined values that are referred to by the family of equations 600a and 600f of FIGS. 6a and 6f. FIG. 6c shows a system level circuit topology 600c for the PLL that may be described by a netlist (or other type of circuit description that may be used to describe a circuit topology). FIG. 6d shows an embodiment of a netlist that may be used to describe the PLL topology of FIG. 6c. FIG. 6e shows an example of how the family of equations 600a and 600f of FIGS. 6a and 6f may be expanded so as to account for different operating points of the PLL.

Referring to FIG. 6c, the building blocks that make up the PLL 600c includes a phase detector (PFD) 601c, a charge pump (CP) 602c, a loop filter (LF) 603c, a voltage controlled oscillator (VCO) 604c and a feedback divider (DIV) 605c. Initially, an automated design tool may be tailored to configure (e.g., automatically or with the help of a designer) the system level circuit topology 600c of FIG. 6c (e.g., with a netlist such as that observed in FIG. 6d). Referring to either of FIGS. 6a, 6f, 6b, or 6c, note that (with the exception of the LF.C1, LF.C2 and LF.R terms) transistor level information is devoid from the descriptions provided therein.

As will be made apparent in subsequent sections of this application, as a result of the design tool automatically "drilling down" through multiple levels of detail, multiple threads of circuit level detail are developed. Here, each thread should extend from the high level, system representation of the PLL (e.g., as embodied in the equation set 600a and 600f in FIGS. 6a and 6f and the netlist 600d of FIG. 6d) toward (finally) a transistor level description. Thus, in the sections following the present section, each of the PLL's building blocks 601c through 605c will be examined in greater detail. Here, an embodiment of a transistor level description (or at least a portion thereof), as implemented with additional transistor level posynomial/monomial equations and a circuit topology (from which a netlist can be readily developed) will be provided for each building block 601c through 605c. As such, the reader should be able to gain an appreciation as to how a software design tool can automatically develop a transistor level description of a PLL.

Thus, for each building block 601c through 605c, additional monomial and/or posynomial equations will be provided; wherein, these additional equations may be substituted (e.g., in accordance with the methodology 500a of FIG. 5a) into their corresponding variable within the family of equations 600a and 600f of FIGS. 6a and 6f (in order to expand upon the system level equation set 600a and 600f). In some cases, as examples, the result of these aforementioned substitutions will be shown so that the reader can gain an understanding into how a system level set of equations 600a and 600f for a PLL may be made to expand into greater detail as the PLL is described at (or at least closer to) a transistor level of detail. Similarly, a transistor level netlist for the loop filter 603c, a transistor level netlist for the VCO 604c and a transistor level netlist for the charge pump 602c will be substituted into the system level netlist 600d of FIG. 6d (e.g., in accordance with the methodology 550 of FIG. 5b) so that the reader can gain an understanding into how a system level circuit topology description may be made to expand into greater detail as the PLL is described at a transistor level of detail. As such, the description that follows is written with an eye toward the methodologies 500, 550 observed in FIGS. 5a and 5b.

With an understanding that a system level description may be embodied with a PLL system level netlist (e.g., as depicted in FIG. 6d) that describes a PLL system topology (e.g., as depicted in FIG. 6c) in terms of its constituent building blocks 601c through 605c, an examination into an embodiment of family of monomial and/or posynomial equations 600a and 600f (as depicted in FIGS. 6a and 6f) is presently appropriate. Referring then to FIGS. 6a and 6f, note that the family of equations are organized into: 1) an equation 621 that describes the semiconductor surface area consumption of the PLL; 2) an equation 622 that describes the power consumption of the PLL; 3) a sub-family of equations 623, 624, 625, 626 that describe the static phase error of the PLL; 4) a sub family of equations 627, 628, 629, 630 that describe the output frequency of the PLL; 5) a sub family of equations 631, 632, 633, 634 that describe the stability of the PLL; 6) a pair of equations 635, 636 that describe the peak jitter of the PLL; and, 7) a pair of equations 637, 638 that describe the sensitivity of the PLL to fluctuations in the supply voltage VDD (which may be referred to as power supply rejection). A discussion of each of these follows below.

5.2.1 Area and Power Consumption.

Consistent with the PLL being described at a system level of detail, the PLL's semiconductor surface area consumption is described in equation 621 in terms of constituent basic building blocks 601c through 605c. That is, the area of the PLL is set equal to the summation of a variable that describes the area of the phase detector (PFD.AREA), a variable that describes the area of its charge pump (CP.AREA), etc. Note that equation 621 is in posynomial form, assuming the area of all constituent blocks are also in posynomial form. Similarly, the PLL's power consumption is also described in equation 622 in terms of its constituent basic building blocks 601c through 605c. That is, the power consumption of the PLL is set equal to the summation of a variable that describes the power consumption of the phase detector (PFD.AREA), a variable that describes the power consumption of the charge pump (CP.AREA), etc. Note that equation 622 is also in posynomial form.

5.2.2 Static Phase Error

A sub family of equations 623, 624, 625, 626 are used to describe the static phase error of the PLL (recall that static phase error was discussed in the background at Section 2.1). Note that equations 623 and 625 are posynomial while equations 624 and 626 are monomial. Equation 623 defines the static phase error for the PLL in terms of various phase detector and charge pump related variables (e.g., noting the PFD. and CP. based variables) as observed in terms 623*b*, 623*c*, and 623*d*; and a variable PLL.DELTA_T_STD_DEV 623*a* that is further described by equations 624 and 625. Note that equation 624 merely takes the square root of the quantity defined by equation 625. Examining equation 625 in further detail it is clear that equation 625 also uses phase detector and charge pump related variables. As such, the static phase error for the PLL is described in terms of various characteristics associated with the PLL's phase detector and charge pump.

The static phase error of a PLL is typically viewed as having random components and systematic components. Here, the systematic components are expressed through terms 623*b*, 623*c* and 623*d* of equation 623 while the random components are expressed through equation 625 (whose summation undergoes a square root operation via equation 624 in order to equalize the units of the random terms with those of the systematic terms). Referring to the systematic terms first, term 623*b* (PFD.DELTA_TERROR) effectively describes a fixed time difference between the pair of phase detector outputs ("up" and "down"). Better said, the phase detector (e.g., as a result of different path lengths within the phase detector) may fixedly signify a positive error term larger than (or smaller than) the expected error term. The PFD.DELTA_TERROR term 623*b* corresponds to the speed difference (e.g., in seconds).

Term 623*c* effectively describes a difference, per error term, between the charge that is added to the loop filter and the charge is removed from the loop filter. The charge pump 602*c*, according to one embodiment, is designed with a current pushing circuit section that adds charge to the loop filter and a current pulling circuit section that extracts charge from the loop filter. Furthermore, according to a further embodiment, for each error term, the phase detector is designed to turn "on" both of these circuit sections (i.e., both the "up" and the "down" outputs are activated), for a fixed period of time PFD.TRESET regardless of the error term magnitude or polarity.

Here, a fixed difference between the amount of charge that is added and the amount of charge that is removed per error term over the course of the PFD.TRESET time will generate static phase error because, in a sense, an error term will be created from the perspective of the VCO when the phase detector issues an error term of zero magnitude; and, likewise, an error term will not be created from the perspective of the VCO when the phase detector issues an error term that perfectly offsets the difference in charge described above. Here, CP.DELTA_IP corresponds to the difference in current generated by the current pushing and current pulling charge pump circuit sections described just above; and, CP.IP corresponds to the current that is pushed by the current pushing section; or, equivalently, the current that is pulled by the current pulling section.

Term 623*d* effectively describes charge that is added (or removed) from the loop filter, by the charge pump, for reasons other than the phase detector's simultaneous activation of both the "up" and "down" inputs over the PFD.TRESET time period. For example, as described in more detail below with respect to the transistor level description of the charge pump, the charge pump may be designed to include a voltage follower circuit between the current pushing and current pulling sections that undesirably adds charge to the loop filter (e.g., due to an offset voltage in an operational amplifier that is used to implement the voltage follower). Here, the term CP.DELTA_QSTAT represents the amount of this charge that is added per unit of pushing current or pulling current (CP.IP).

The causes of static phase error described just above may exist not only in a fixed, systematic fashion—but also in a random fashion (e.g., with wafer to wafer variation). Equation 625 helps summarize these random contributions to static phase error. As such, variables such as CP.IP_VARIANCE and CP.VARIANCE_QSTAT (which are described in more detail below with respect to the transistor level description of the charge pump) are employed. Note that, consistent with principles of statistics, the variances of independent, random occurrences may be directly added. Equation 625 corresponds to the summation of the variances of the causes described just above. Here, as variance corresponds to the square of the standard deviation of a random occurrence, equation 624 takes the root of the variance so that that the units are the same for each of the terms 623*a* through 623*d* in equation 623 (e.g., seconds) rather than disparate (e.g., seconds2 for random terms and seconds for systematic terms). Note that the user defined constant σ in term 623*a* can be used to define the peak static phase error in terms of a number of standard deviations of the PLL. DELTA_T_STD_DEV Finally, equation 626 allows the circuit designer to specify an upper limit for the static phase error of the PLL that is to be designed. Here, be specifying that the static phase error should be less than or equal to a certain amount of time, a specific posynomial constraint will be applied to equation 626. As such, when equation 626 participates in the geometric problem solving sequence, the transistor dimensions that will be defined as a result of the geometric problem solving process will automatically correspond to a PLL having a static phase error that falls within the range originally specified by the user via equation 626.

5.2.3 PLL Output Frequency

Equation 627 specifies the PLL output frequency as being equal to the output frequency of the VCO. Equation 630 also specifies the PLL output frequency in terms of the feedback division (DIV.M) performed by the feedback divider 605*c* and the frequency of the input reference signal PLL.INPUT_REF_SIGNAL_FREQ. Both of these follow directly from the topology 600*c* of the PLL as well as basic principles of PLL operational theory. Equations 628 and 629 allow the designer to specify a minimum and maximum operating frequency for the PLL. For example, if the designer's application can tolerate some slack in the specific output PLL output frequency (e.g., 1.000 GHz+/−0.002 GHz) the user may specify the frequencies at either end of the allowable frequency range (e.g., 0.998 GHz at the low end and 1.002 GHz at the high end).

These, in turn, correspond to two different operating points that the PLL may be designed to work according to. FIG. 6*e* illustrates the effect that multiple operating points may have on the family of monomial and posynomial equations. According to FIG. 6*e*, as a result of a pair of operating points being specified by the designer (e.g., mm PLL output frequency and max PLL output frequency), the family of monomial and posynomial equations 600*a* and 600*f* of FIGS. 6*a* and 6*f* may be expanded (e.g., doubled) such that the overall family of equations used for geometric problem solving 600*e* has a first set 600*a*1 that corresponds to the constraints that apply at the first operating point (e.g., the maximum allowable frequency range); and a second set

600a2 that corresponds to the constraints that apply at the first operating point (e.g., the minimum allowable frequency range).

Here, note that various system level characteristics may change in light of the different operating point whereas others may not change. For example, the power consumption of the PLL should be greater at the maximum PLL output frequency than at the minimum PLL operating frequency. As such, a different numeric quantity should appear for PLL.PWR in family set 600a1 as compared to family set 600a2. Here, if the designer were to specify a maximum allowable power consumption (e.g., with a PLL.PWR_USER_SPEC input which is not indicated in FIGS. 6a and 6f for simplicity), the geometric problem solving process would provide a solution (if possible) that kept the power consumption within the specified range for each operating point.

Note that a nominal PLL output frequency specification (e.g., 1.000 GHz) could also be added (which would add a third family set of equations 600a3). Generally, users may define specifications for any of the variables in the family of equations. Some of these may be used to develop the PLL in light of specific environmental conditions; which, effectively correspond to different operating points as well (e.g., min, nominal and maximum supply voltage VDD; min, nominal and maximum temperature, etc.). So doing will add more constraints to the optimization process (which are represented by each additional family set). Some variables may not vary across different operating points (e.g., area); and, as such do not need to be replicated across each family set for each operating point.

5.2.4 Stability

The stability of the PLL is accounted for with equations 631 through 634. Note that equation 631, 633 and 634 are monomial while equation 632 is posynomial. Equation 631 describes the cross over frequency while equation 632 describes the phase margin. Recall that both cross over frequency and phase margin were discussed in the Background in Section 2.2. Here, the cross over frequency is expressed as the frequency where the magnitude of the transfer function through the loop is equal to unity. As the transfer function of the loop is the product of the transfer function for each of the phase lock loop's basic building blocks, note that equation 631 resembles the product of the "gain" for each of the phase detector (PFD.GAIN), charge pump (CP.IP), loop filter (LF.R) and VCO (VCO.GAIN) normalized by the "gain" of the feedback divider (DIV.M).

Equation 632 provides an expression for the phase margin. Here, as the phase of the PLL channel is mostly determined by the loop filter and the VCO, equation 632 in expressed in terms of the loop filter components LF.R. LF.C2 and a performance characteristic of the VCO that is related to the phase delay through the VCO (VCO.TAU3). Furthermore, as the phase margin corresponds to how far above −180 degrees the phase of the PLL channel is at the cross over frequency, note that the PLL cross over frequency PLL.CROSS_OVER_FREQ also appears in equation 632. Note that the embodiment of FIGS. 6a and 6f allows the user to specify both the cross over frequency and phase margin (via equations 633 and 634). Specifying these parameters will impose numeric constraints on equations 631 and 632; which, in turn, will result in a family of equations that will cause the geometric problem solving process to provide transistor level details for a PLL having the stability characteristics specified by the designer. 5.2.5 Peak Jitter The peak jitter of the PLL is accounted for with equations 635 and 636. Note that equation 635 is posynomial. Jitter was first discussed in the Background in Section 2.3. Peak jitter is, basically, an approximation of the maximum extent of that jitter that will be apparent in the PLL output signal. Here, as jitter corresponds to the time variation of the VCO output signal frequency, the jitter will be apparent in the time domain, for example, by variation in the position of the PLL output signal's rising edges and/or falling edges. The maximum approximate extent of the variation of these edges corresponds to one perspective of peak jitter.

Peak jitter, like static phase error, may have random and systematic components. Here, term 635a expresses the random component of the peak jitter and term 635b expresses the systematic component of the peak jitter. The random component 635a effectively describes the effect of thermal fluctuations in terms related to the gain of each of the various building blocks of the PLL; and, a special characteristic of phase noise in electrical oscillators that is expressed as the VCO characteristic variable VCO.KAPPA. The systematic term 635b describes the peak jitter that results from a pair of jitter noise sources that originate from the activity of the phase detector and charge pump.

As such, note that the systematic term 635b refers to phase detector related variables PFD.TRESET, PLL.INPUT_REF_SIGNAL_FREQ; and, the charge pump related variable CP.DELTA_IP. These jitter noise sources are effectively combined and then modified by the remainder of the transfer function of the PLL. As such, note that terms related to the "gain" of the loop filter, VCO and feedback divider (i.e., LF.R; VCO.GAIN; DIV.M) appear in term 635b. The transfer function of the PLL is further approximated with term 635b1. Here, constants $\alpha$ and B are set to values that make the approximation more accurate. In an embodiment $\alpha$=0.84 and B=−1.95. The user can also specify an allowable range for peak jitter as observed with respect to equation 636.

5.2.6 Power Supply Rejection

Power supply rejection relates to the sensitivity of the PLL output signal frequency to fluctuations in the supply voltage VDD. Here, as the VCO is a voltage sensitive device and as the VCO provides the PLL output signal, this characteristic of the PLL (PLL.VDD_DC), like the PLL output signal frequency in equation 627, is expressed in terms of the VCO itself (via VCO variable VCO.VDD_DC). The user can also specify an allowable range for this PLL characteristic.

5.3. Variables Dependent of Lower Level Expressions

FIG. 6b shows each of the variables that are called out by the family of equations 600a and 600f of FIGS. 6a and 6f. FIG. 6b organizes these variables in terms of the specific building block to which they relate; or, alternatively, as a user defined variable (if the variable is to be defined by the user according to the embodiment of FIGS. 6a and 6f). As such, each of the variables associated with the phase detector 601b, charge pump 602b, loop filter 603b, VCO 604b and feedback divider 605 b are represented in FIG. 6b. Furthermore, each of the user defined variables are also listed 606b. Here, in accordance with methodology 500 of FIG. 5a, the non user defined variables 601b through 605b would be recognized as having a dependency on a lower level expression (perhaps with the exception of the loop filter components LF.R, LF.C1 and LF.C2 because these may be viewed, according to some embodiments, as already being at the transistor level of detail).

6.0 Embodiments of PLL Building Block Profiles

6.1 Overview

The previous section related to an embodiment for describing a PLL at the system level in terms of its constituent building blocks. The present section describes embodiments for each the various building blocks (e.g., the phase detector, charge pump, loop filter, VCO and feedback divider) of which the PLL system is comprised. Each of these descriptions will provide more detailed monomial/posynomial expressions for each of the variables that the higher level PLL description discussed in the previous section depends upon. Furthermore, a circuit topology (from which a netlist could be readily derived) for each of the building blocks is also provided. As such, as described in a following section, the information presented in the present section (Section 6.0) may be substituted into the information provided in the previous section (Section 5.0) in order to develop a description of a PLL toward a greater level of detail.

6.2 Phase Detector, Loop Filter and Feedback Divider

Figure 7A:
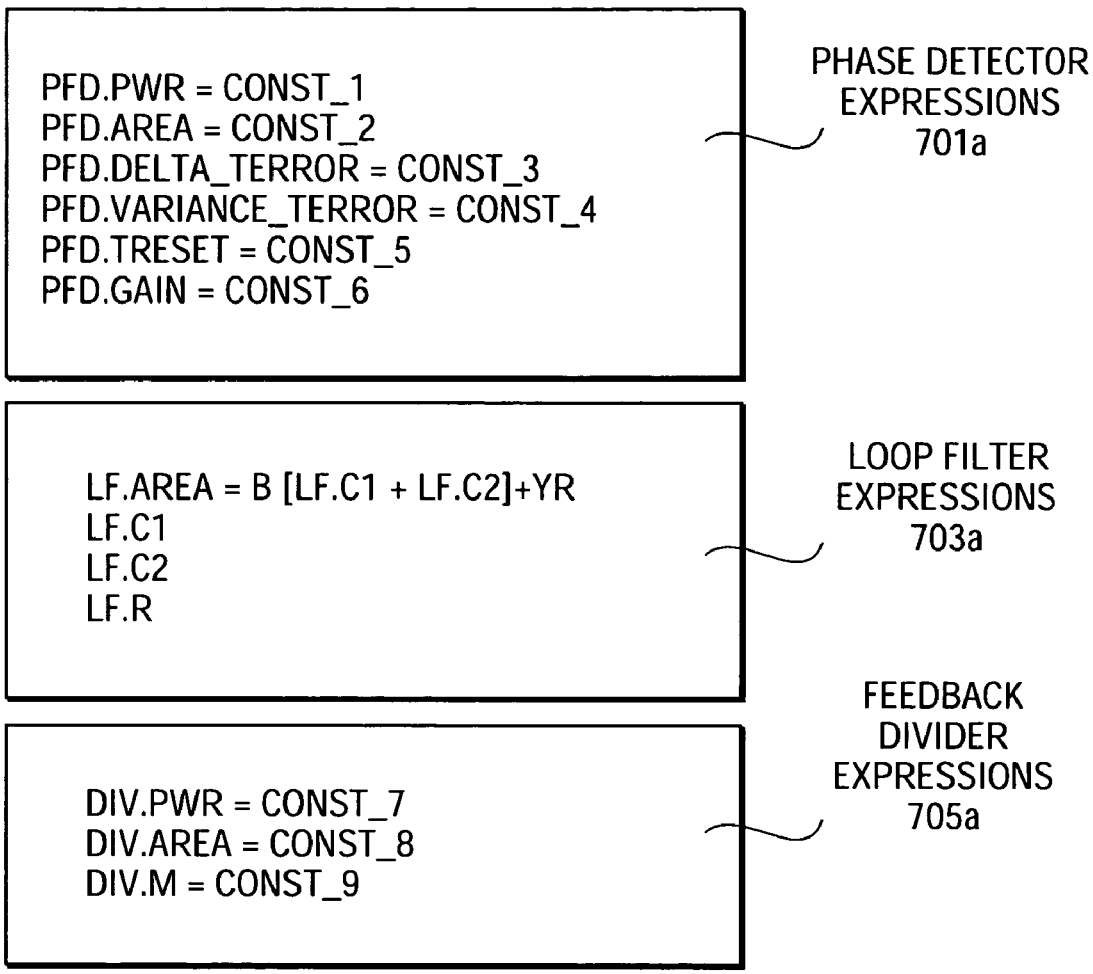
Figure 7B:
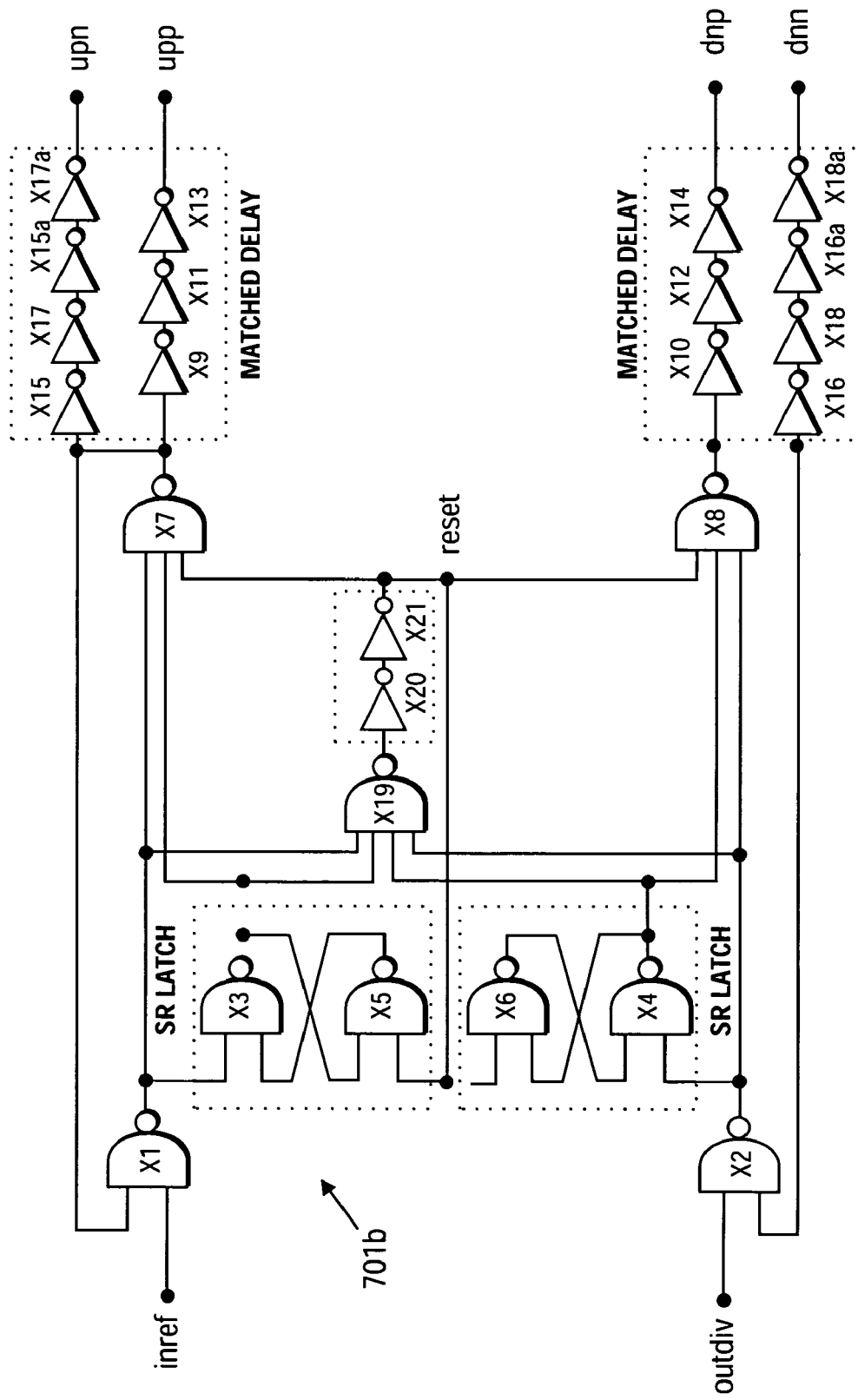
Figure 7C:
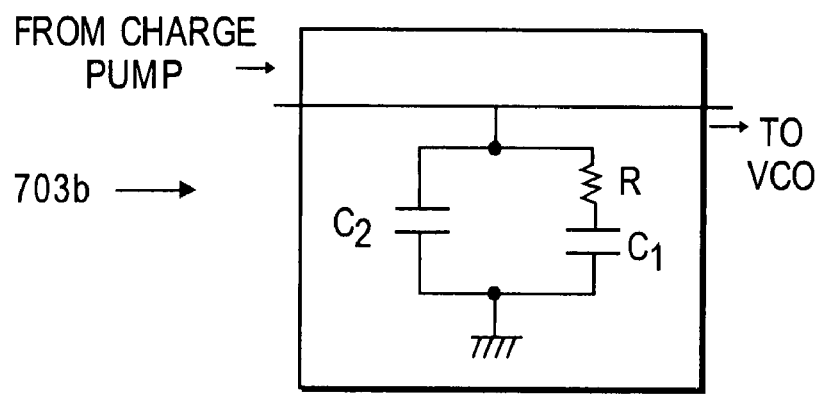
Figure 7D:
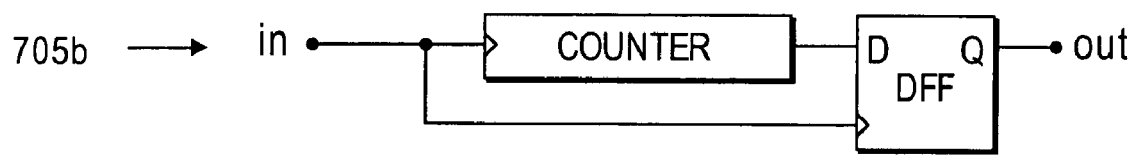

FIG. 7a shows a monomial/posynomial equation family for the phase detector 701a, loop filter 703a and feedback divider 705a that further describe the variables that the system level PLL description discussed in Section 6.0 depends upon; and, FIGS. 7b through 7d show shows a more detailed circuit topology embodiment 701b, 703b, 705b for each of these same building blocks, respectively. According to an embodiment, referring to FIG. 7a, a "fixed" circuit design is used for both the phase detector 701 a and the feedback divider 705 a. As such, the properties of these building blocks are expressed as "constants" (i.e., do not vary) rather than variables. This simply means that these building blocks are not "optimized" by the geometric problem solving process. However, their properties (as represented by constants Const_1 through Const_9) take part in the geometric solving process.

That is, as constants Const_1 through Const_9 are numeric quantities that describe the corresponding characteristic to which they are labeled (e.g., Const_1 for the phase detector power, Const_2 for the phase detector area, etc.), their substitution into the PLL equation family set (e.g., as depicted in FIGS. 6a and 6f) will effectively add additional numeric constraints to the geometric optimization problem. Better said, the geometric problem solving process will attempt to optimize the charge pump components, loop filter components and VCO components in light of the numeric constraints (Const_1 through Const_9) that are imposed by use of a pre-configured, "fixed" phase detector and frequency divider design. This approach may be used if it is believed that the charge pump and frequency divider (perhaps because they make use of digital circuitry) do not add much to the overall optimization issue.

That is, where multiple operating points and/or user specified design constraints will prove to mostly alter the charge pump, loop filter and VCO anyways. In such instances, the phase detector and frequency divider may as well be fixed to reduce computation complexity. As such, according to such an approach, a transistor level netlist (e.g., in an HSPICE format) is included with the design software. Here, for each potential target manufacturing process (e.g., IBM 0.13 micron, IBM 0.18 micron, TI 0.13 micron, TI 0.18 micron, etc.), the pre-configured phase detector and feedback divider may be simulated beforehand so that the set of constants Const_1 through Const_9 can be generated (e.g., for each design point specified by the designer). Note that each of the expressions associated with the phase detector 701a and feedback divider 705a are in monomial form. In alternative embodiments, the phase detector and/or feedback divider may be optimized along with the other building blocks. In this case, expressions written in monomial and/or posynomial having variables (as opposed to constants) should be used.

The expressions for the loop filter 703a describe the area of the loop filter in terms of the area of each of its components. Here, the area of each component is related to its electrical value (e.g., capacitance for a capacitors C1 and C2 and resistance for resistor R) through a constant $\beta$ for capacitors C1, C2 and another constant $\gamma$ for resistance R. The specific capacitance and resistance values LF.C1, LF.C2 and LF.R are variables that are explicitly solved for by the geometric solving process (according to this embodiment) and therefore represent a lowest level of detail.

Referring to the circuit topologies 701b, 703b, and 705b of FIGS. 7b. 7c, and 7d, respectively, those of ordinary skill may readily develop a transistor level netlist for each. Here, according to the embodiment discussed above wherein the phase detector and feedback divider are fixed, a netlist (e.g., in HSPICE format) for each of these building blocks is included with the design tool software (e.g., as part of a database) so that they may be substituted into the system level netlist of the PLL (e.g., as depicted in FIG. 6d) in accordance with methodology 550 of FIG. 5b. Likewise, a netlist that describes the topology of the loop filter 703b may also be included with the design tool software. More detail regarding the automatic expansion of the PLL netlist are described below in Section 7.0.

Figure 8B:
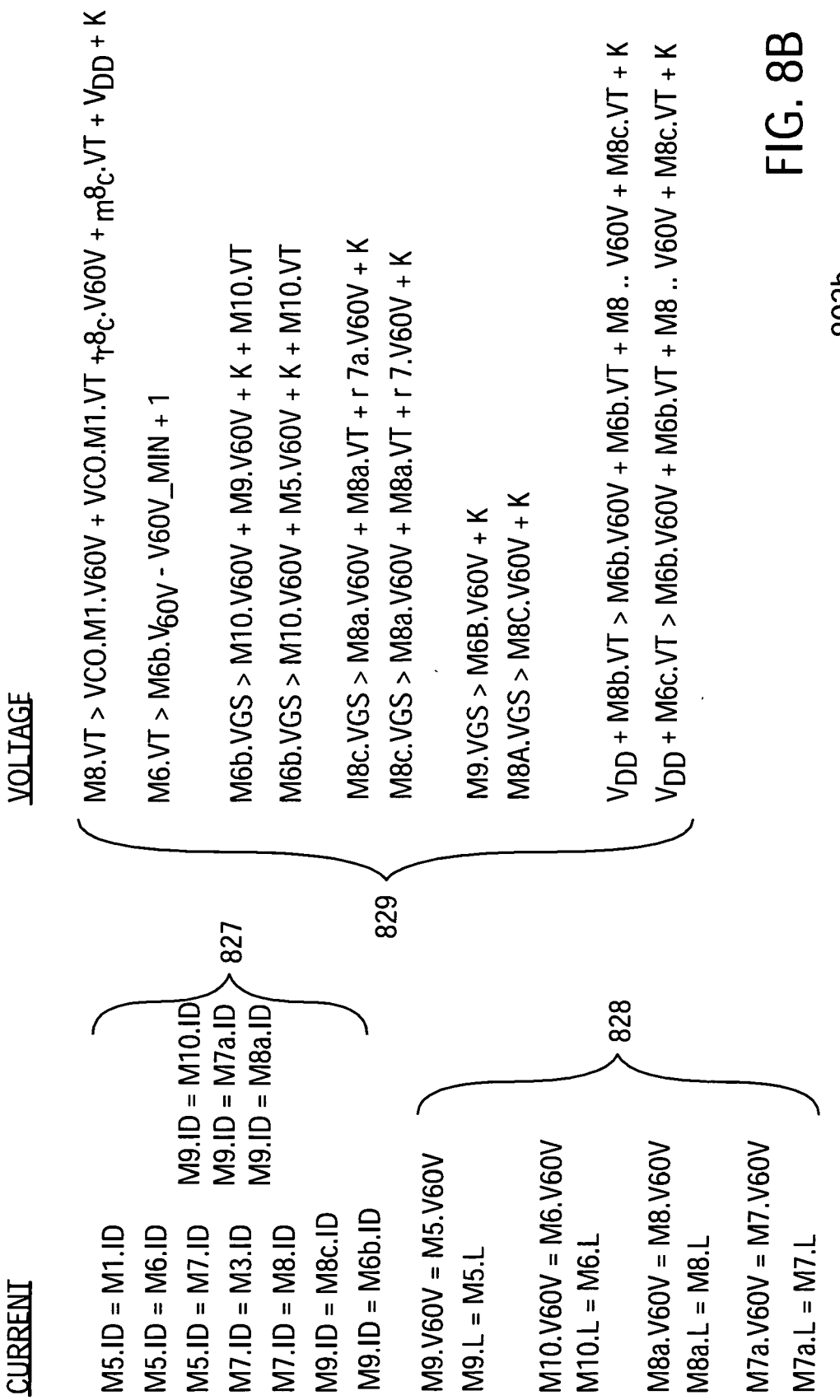

FIG. 8a shows an embodiment of a family of monomial/posynomial equations 820 through 826 that describe the charge pump variables that the PLL system level description embodiment of FIGS. 6a and 6f is dependent upon (as summarized in table 602b of FIG. 6b). Here, note that equations 820 and 822 through 826 are posynomial; and, equation 821 is monomial. FIG. 8b shows additional equations 802b (in posynomial and/or monomial form) that can be added to the family of equations for geometric problem solving. Here, the equations of FIG. 8b describe the "DC biasing" conditions of the charge pump circuit. An embodiment of a charge pump circuit 802c to which both sets of equations 802a, 802b relate is shown in FIG. 8c.

Figure 8C:
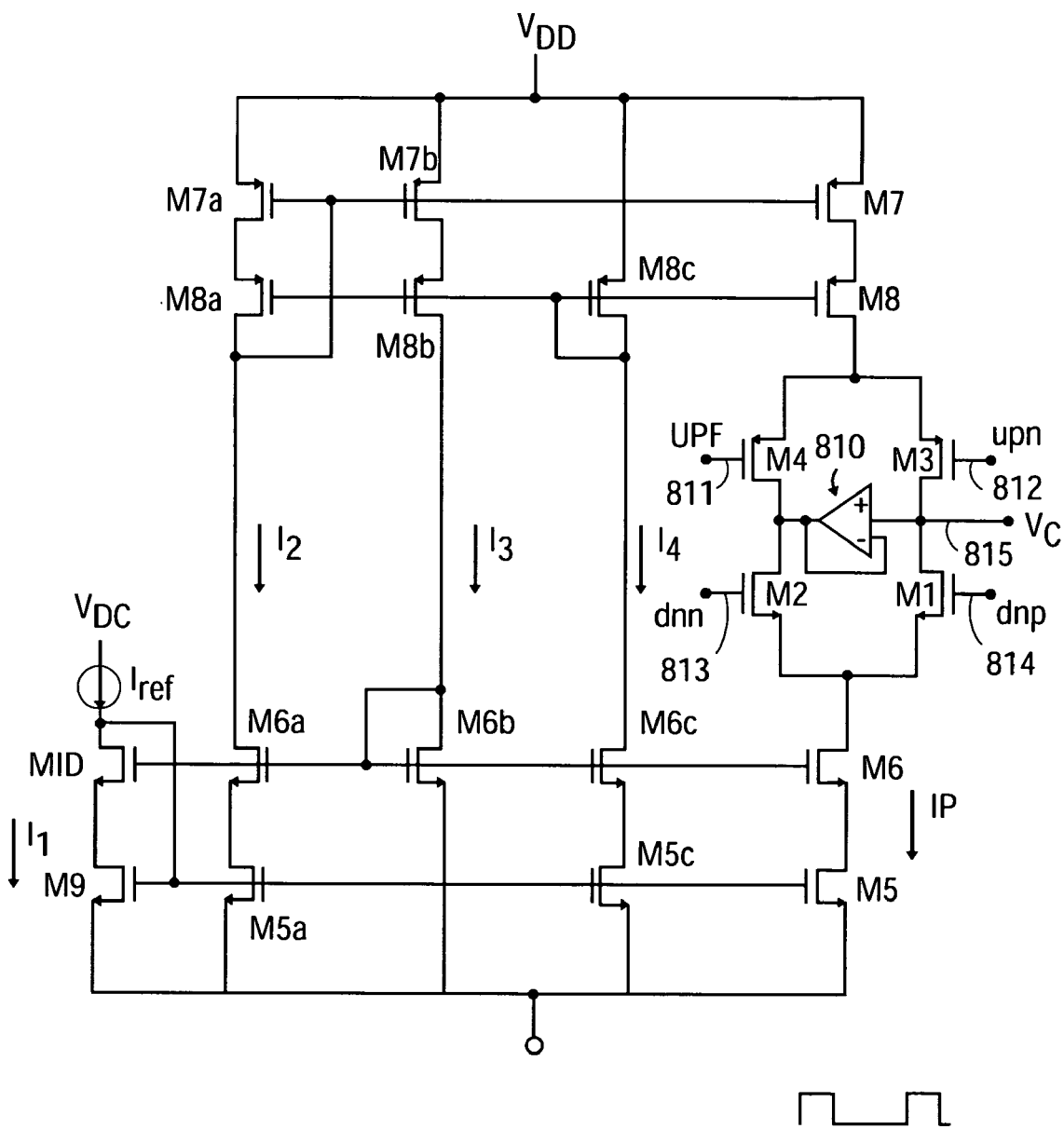

According to the circuit design approach of FIG. 8c, a current mirror arrangement is established between four current legs I1, I2, I3, I4. Here, M9 acts as the basis for the current mirroring. As such, the current I1 through M9 (and M10) is designed to be equal to: 1) the current I2 through M5a (and M6a and M8a and M7a); 2) the current I3 through M6b (and M8b and M7b); and 3) the current I3 through M5c (and M6c and M8c). Given the current equalities in the four current legs I1 through I4, the equation 820 for the power consumption of the charge pump (as expressed in FIG. 8a) is the product of VDD and the summation of four times the current through M9 (M9.ID) plus the current through M5 (M5.ID). Equation 821 defines the charge pump current CP.IP as the pulling current of the charge pump. Here, note that the syntax "ID" is used to refer to the drain to source current of the identified transistor.

Equation 822 describes the difference between the pushing charge pump current and the pulling charge pump current (where the pushing charge pump current flows through M7 and M8 and out output 815; and, the pulling charge pump current flows into output 815 and through M6 and M5). Equation 822 describes this quantity as VDD/2 times the output conductance of the charge pump. Here, the output conductance of the charge pump is a function of the conductance of each of transistors M5 through M89 as indicated by syntax "gd"; and, the transconductance of transistors M6 and M8 (as indicated by syntax "gm").

Equation 823 expresses the variance in the charge pump current difference described just above. The variance in charge pump current is a function of the variance of the drain current of each of transistors M5 and M7. Here the first two terms of equation 823 correspond to the drain current variance of transistor M5 while the last two terms of equation 823 correspond to the drain current variance of transistor M7. Here, W refers to transistor gate width, L refers to transistor gate length, NF refers to the number of fingers used to implement the transistor (as such the effective transistor width corresponds to W(NF). DELTA.VT corresponds to the variation in transistor threshold voltage and Z corresponds to the percent variation in the saturation current (which are both process dependent numbers obtainable from the target manufacturing process).

Equations 824 and 825 relate to the offset and variance associated with the charge that is added to (or removed from) the loop filter via output 815 by means other than the pushing current circuitry (which is embodied by transistors M7 and M8) and the pulling current circuitry (which is embodied by transistors M6 and M5). Specifically, the charge referred to just above is modeled as arising out of the voltage follower that is constructed with operational amplifier 810. Here, the offset input voltage associated with the amplifier 810 (OPAMP.DELTA_VIN; and, in units of variance: OPAMP.VARIANCE_VIN) multiplied by the capacitances associated with transistors M6, M2, and M1; or transistors M8, M4 and M3 is the source of the charge which is transferred to the output 815.

As such, both of equations 824 and 825 are functions of the opamp 810 offset voltage and these capacitances (where Cgs corresponds to gate to source capacitance, Cgd corresponds to gate to drain capacitance; and Cdb corresponds to the drain to bulk capacitance.Equation 826 expresses the area of the charge pump as the summation of the area of each of its constituent transistors. β is a process dependent variable obtainable by those of ordinary skill. Note that the number of fingers (NF) may be taken into account for the transistors (e.g., by incorporating the NF value for the transistor in its corresponding product term).

FIG. 8b shows an embodiment of a family of DC biasing related equations 802b (expressed in posynomial and/or monomial form) that can be added to the family of equations used for geometric problem solving. Adding DC biasing equations to the family of monomial and posynomial equations helps to ensure that the geometric solution (when obtained) will correspond to a solution where the proper biasing of the charge pump is accounted for. Here, monomial equations 827 effectively describe the current relationships between the transistors M5, M6, M7, M8, M1 and M3 responsible for pushing or pulling current to/from the loop filter. The current mirror relationship between I1 (M9.ID) and current legs I3 and I4 (M6b.ID and M8c.ID) is also described.

Equations 828 describe additional current mirroring relationships. Here, note that VGOV corresponds to the term VGS-VT where VGS is gate to source voltage and VT is the threshold voltage. Equations 829 describe conditions that keep the transistors of the charge pump in "saturation" mode. Here, saturation mode corresponds to a state of high output conductance. Here, by keeping the transistors in their saturation region, the transistors will be biased so as to be kept in a region that is appropriate for their implementation.

FIG. 8c shows an embodiment of a topology for the charge to which the equations of FIGS. 8a and 8b relate. Here, note that the phase detector output is differential for both the "up" and "down" error term signals. That is, a pair of "up" charge pump inputs exist (811, 812) and a pair of "down" charge pump inputs exist (813, 814). This information may be further added to the system level netlist description; or, the system level netlist may be made to account for differential outputs in its initial definition.

6.4 VCO

Figure 9C:
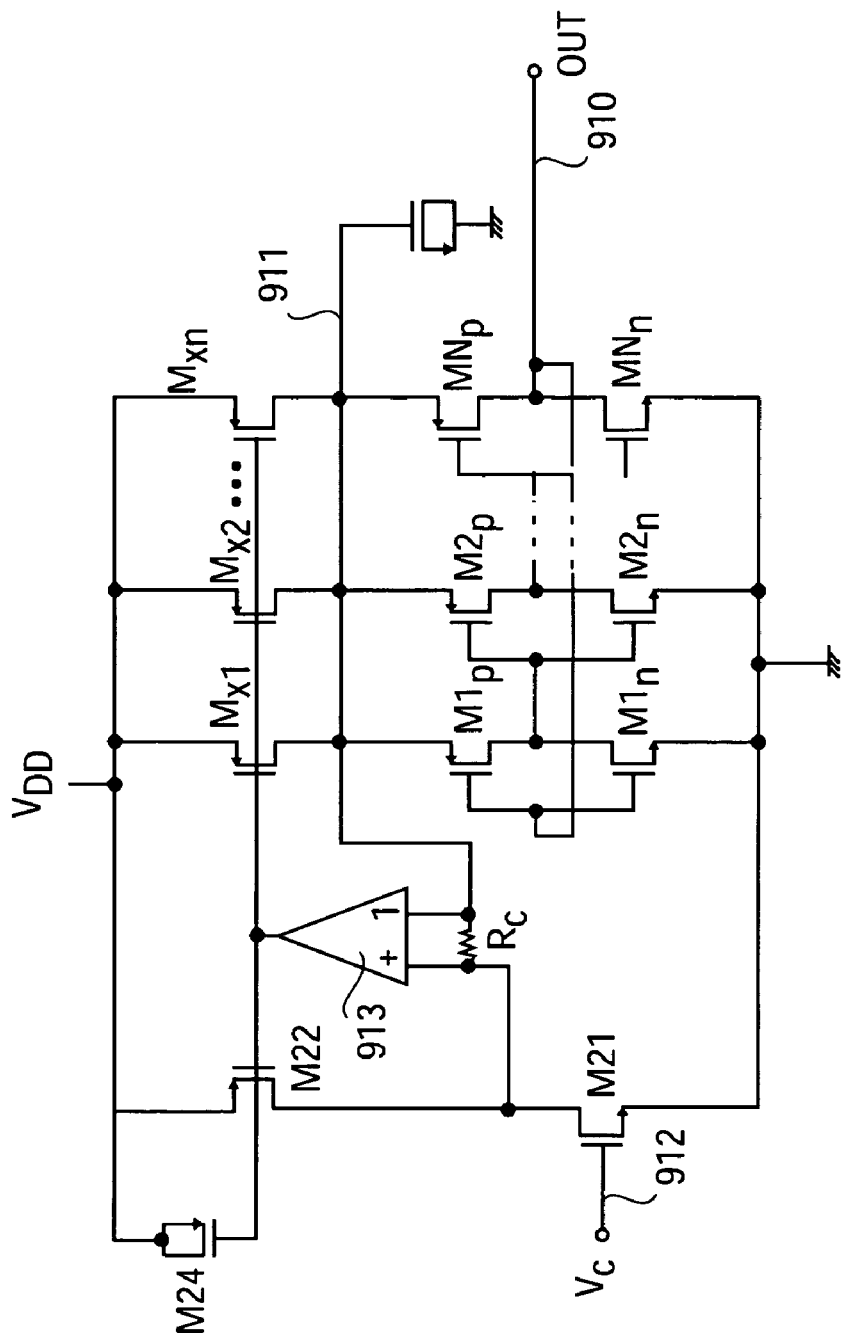

FIG. 9a shows an embodiment of a family of monomial/posynomial equations 920 through 925 that describe the VCO variables that the PLL system level description embodiment of FIGS. 6a and 6f is dependent upon (as summarized in table 602b of FIG. 6b). Here, note that equations 920, 921 and 923, 924 are posynomial while equation 922 and 925 are monomial (noting that the expression μn+μ p is a constant as described in more detail below). FIG. 9b shows additional equations 905b (in posynomial and/or monomial form) that can be added to the family of equations for geometric problem solving. Here, the equations of FIG. 9b describe the "DC biasing" conditions of the VCO. An embodiment of a VCO circuit 802c to which both sets of equations 902a, 902b relate is shown in FIG. 9c.

According to the design of FIG. 9c, a ring of N delay stages (where each delay stage corresponds to a pair of totem poled Mp and Mn transistors (e.g., M1p and M1n correspond to a first delay stage; M2p and M2n correspond to a second delay stage; and, MNp and MNn correspond to the Nth delay stage). The delay stages are arranged in a ring such that an oscillation is created at output 910. The frequency of the oscillation is a function of the voltage on node 911. Here, as the voltage rises on node 911, the frequency of oscillation increases (because the delay stages operate "faster"); and, likewise, as the voltage on node 911 falls, the frequency of oscillation decreases. As the voltage on node 911 is correlated to the voltage presented at input node 912, the voltage to frequency conversion performed by the VCO is readily apparent.

Referring to FIG. 9a, the power consumption of the VCO is expressed by equation 920 as the power consumption of opamp 913 and the product of Vdd and the summation of the current through M21 (M21.ID) and NMx1.ID. Here, NMx1.ID corresponds to the current through each of transistors Mx1 through MxN. The area of the VCO is expressed by equation 921 as the summation of the areas of its constituent transistors and the area of the opamp 912. The gain of the VCO is expressed by equation 922 as the product of: 1) the change in output signal frequency per change in current provided to the delay stages; and 2) the change in current provided to the delay stages in response to a change in voltage at input node 912.

Here, the first bracketed term in equation 922 correspond to the first relationship and the second bracketed term in equation 922 corresponds to the second relationship. Note that the quantity μn+μ p corresponds to the summation of electron mobility and hole mobility in semiconductor materials and may therefore be viewed as a constant. Similarly, Cox(1+ratio) also corresponds to a constant for a particular semiconductor manufacturing process (where Cox is the metal-oxide-semiconductor capacitance and ratio is set to 3.0 in one embodiment (which corresponds to an approximation undertaken to place equation 923 in monomial form).

N corresponds to the number of delay stages in the inverter and is a variable to be solved by the geometric solving process. Mn.W, Mn.ID and Mn.L correspond to the gate width, current and gate length of one of the n type delay stage transistors. Equation 923 describes the VCO.KAPPA term with similar variables as well as boltzman's constant "k", the temperature T, the transconductance of both an Mn and Mp type transistor within a delay stage (Mn.gm and Mn.gm), the VCO output frequency; and, the gate width of a p type transistor within a delay stage (Mn.W). The VCO power supply rejection VCO.VDD_DC is expressed with terms mentioned above as well as the opamp gain (OPAMP.GAIN) and the resistance rc between the + and − inputs of the opamp.

The VCO.TAU3 parameter is described in terms of the opamp input transconductance (OPAMP.gm_in) as well as the gate to source capacitance of M24 (M24.Cgs), the transconductance of transistor M22 (M22.gm) and the conductance of transistor M22 (M22.gd). FIG. 9b shows DC biasing conditions in terms of current mirrors 926, 927 expressed in monomial form as well as dimensional relationships between the transistors within the delay stages that are also expressed in monomial form. Conditions for keeping the transistors operating velocity saturation are also provided in posynomial equations 924 and 930.

6.5 Comment About Transistor Level of Detail

Note that the present section, which has examined the PLL's building blocks at a greater level of detail, has revealed transistor level information for many of these building blocks. For example, the circuit topology of the charge pump (as observed in FIG. 8c) reveals 20 different transistors and an op-amp 810. Likewise, the family of posynomial and monomial equations for the charge pump (as observed in FIGS. 8a and 8b) are replete with transistor level details. That is, variables such as drain to source current (ID), gate to source capacitance (Cgs), gate to drain capacitance (Cgd), transconductance (gm), gate length (L), gatewidth (W) are observed throughout FIGS. 8a and 8b. Similar comments may be said about the VCO as well.

Here, it is important to note that although a geometric problem solving sequence could be attempted at the current level of detail; in alternate embodiments, various transistor level characteristics (e.g., Cgs, Cgd, gm, etc.) could be even further refined so as to be described in terms of the gates widths and gate lengths of their specific transistor. Here, equations from standard textbooks could be used (either directly because the relationships are normally expressed in monomial or posynomial form; or, perhaps soe approximations may be undertaken to craft a relationship in posynomial or monomial form) Regardless, a geometric problem can be solved where most the variables correspond to the gate widths and gate lengths of the various transistors that take part in the optimization process. As a result, the geometric solution will provide specific dimensions for the transistors that are characterized in this fashion.

7.0 Automated Design Tool Technology

Figure 10:
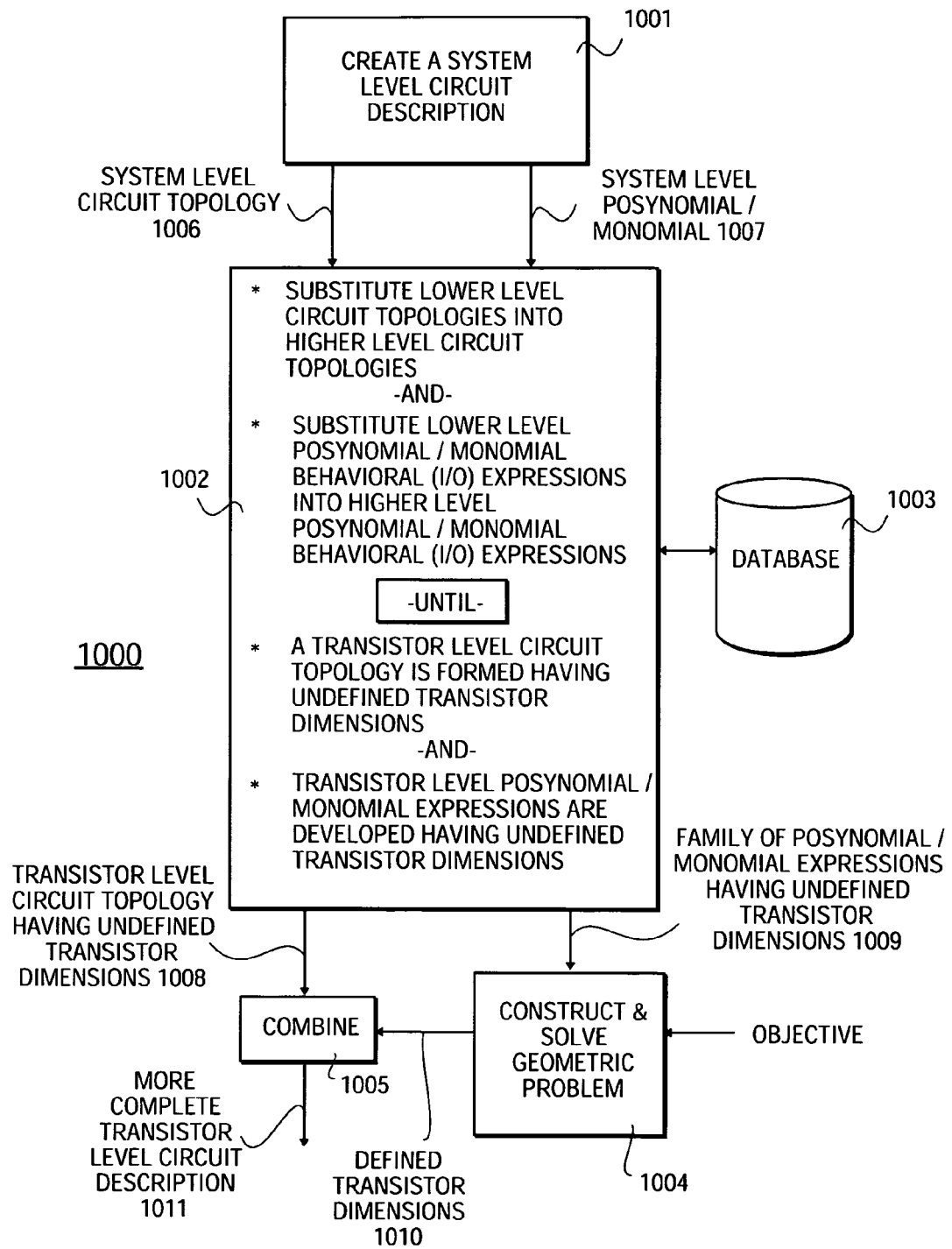

FIG. 10 shows an embodiment of a methodology 100 by which an automated design tool designed according to the principles expressed above may be configured to operate according to. Initially a system level description of a PLL is created 1001. Recall that an example of a system level description was discussed with respect to FIGS. 6a through 6f. Here, the construction of a system level description results in system level circuit topology information 1006 (e.g., the netlist of FIG. 6d) and system level monomial and/or posynomial equations 1007 (e.g., a example of which were shown in FIG. 6a and 6f).

Once the system level description has been created 1001, lower level circuit topology information and monomial and posynomial expressions are substituted, respectively, into higher level circuit topology information and posynomial expressions until a transistor level circuit topology is formed. In an embodiment, the equations are continually substituted until a family of monomial/posynomial expressions are developed having mostly undefined transistor dimensions 1002. Embodiments of methodologies that may be used to perform the substations 1002 of FIG. 10 have been shown with respect to FIGS. 5a and 5b (and, where, the word "system" may be replaced with the phrase" "basic analog building block" as needed in each of these figures). The software may make use of database 1003 that stores the information to be substituted into the higher level descriptions.

Once the transistor level has been reached, transistor level circuit topology information 1008 (e.g., having undefined transistor dimensions)results; and, a family of monomial and posynomial equations 1009 that express the PLL at the transistor level is created. Then, a geometric problem is constructed and solved 1004 which provides numeric details 1010 that define the previously undefined transistor parameters (e.g., dimensions). A particular objective (such as minimizing a particular characteristic such as power consumption or surface are consumption) is usually articulated when constructing the geometric problem. Then, for example, the defined transistor dimensions 1010 are combined 1005 with the transistor level circuit topology information (having undefined transistor level dimensions) so as to form a more complete transistor level description 1011 of the circuit.

Figure 11:
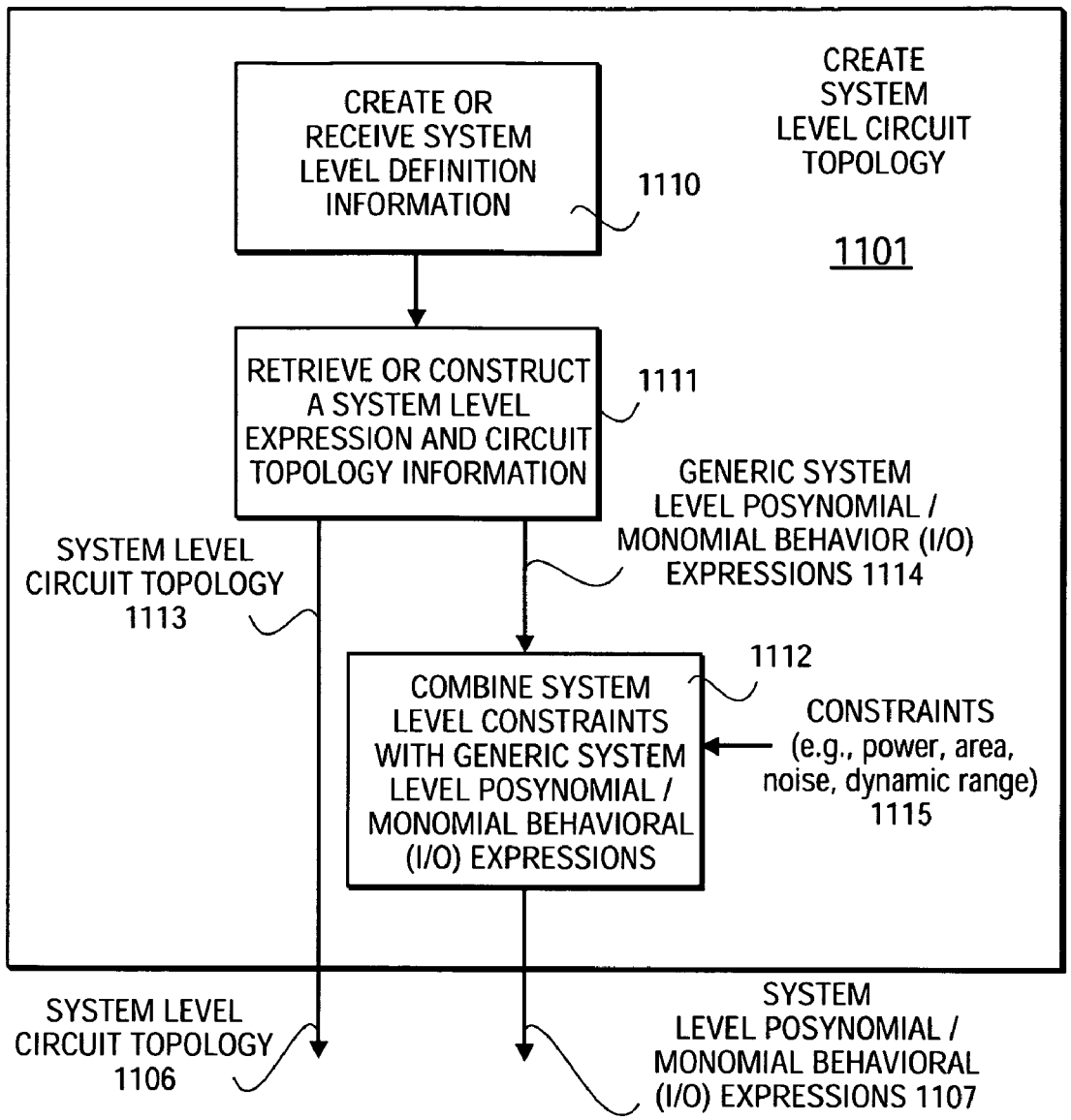
FIG. 11 shows an embodiment of a methodology for creating a system level circuit topology.

FIG. 11 shows an embodiment as to how the system level description of the PLL may be formed 1001. According to the approach of FIG. 11, definitional information of a system is created or received or otherwise provided 1110. Here, definitional information effectively defines the "type" of circuit or system to be constructed (e.g., PLL in this case). Then, system level circuit topology information and system level monomial and/or posynomial expressions are retrieved or constructed 1111. This may be done by the designer, by the software automatically (e.g., by receiving a generic data file from the database for a PLL) or some combination of both. This produces a system level circuit topology 1106 (e.g., a system level netlist for a PLL) and a system level family of monomial and/or posynomial expressions that are left unconstrained (e.g., without specific numeric constraints). Then, constraints 1115 are applied 1112 to the family of unconstrained equations 1114 (e.g., in the form of user_specs). So as to update the family of equations with the desired constraints. Note that each and every equation in the family of equations need not receive a specific constraint (indicating the designer is allowing the particular characteristic to vary at will with the geometric problem solving process).

FIG. 12 provides a specific example as to how the PLL's family of equations become more detailed with each substitution. FIG. 12 shows the original system level equation for PLL power consumption (as expressed in FIGS. 6a and 6f). Equation 1201 of FIG. 12, shows this same equation after the CP.PWR term is substituted with equation 820 of FIG. 8a and the VCO.PWR term is substituted with equation 920 of FIG. 9. Here, note that equation 1201 effectively describes the PLL's power consumption in greater detail by expanding on each of the CP.PWR and VCO.PWR terms with transistor level expressions. Likewise, for each of the non user defined variables of FIG. 6b, a similar substitution could be made which would result in the entire PLL being described at a greater level of detail.

FIG. 13 shows an example as to how the system level netlist can be made to be more detailed as lower level circuit topology information is substituted into the system level netlist. FIG. 13 shows the simple case of the changes made to the system level netlist of FIG. 6d if the circuit topology information of the loop filter of FIG. 7c is substituted in. Here, note that nodes 6 and 7 of the system level netlist of FIG. 6d are merged because the loop filter topology of FIG. 7c indicates that the input and output of the loop filter are the same node. As such, whereas the CP.OUT and VCO.IN nodes were on different nets in the system level description of FIG. 6D, they now share the same node in the more detailed netlist of FIG. 13. Furthermore, whereas the system level netlist of FIG. 6d is devoid of specific resistor and capacitor values (which are considered a low level of detail), note that this information appears when the loop filter specifics are accounted for. Specifically, nodes 2, 6, and 7 contain specific resistance and capacitance details (noting that node 7 was reconfigured so as to correspond to the node between R and C1). Similar to the discussion above with respect to FIG. 12, each insertion of more detailed topological information (e.g., the design for the charge pump or VCO as provided in FIGS. 8c and 9c) will add more nodes and more complexity to the netlist (with corresponds to the netlist being described at a greater level of detail).

Figure 14:
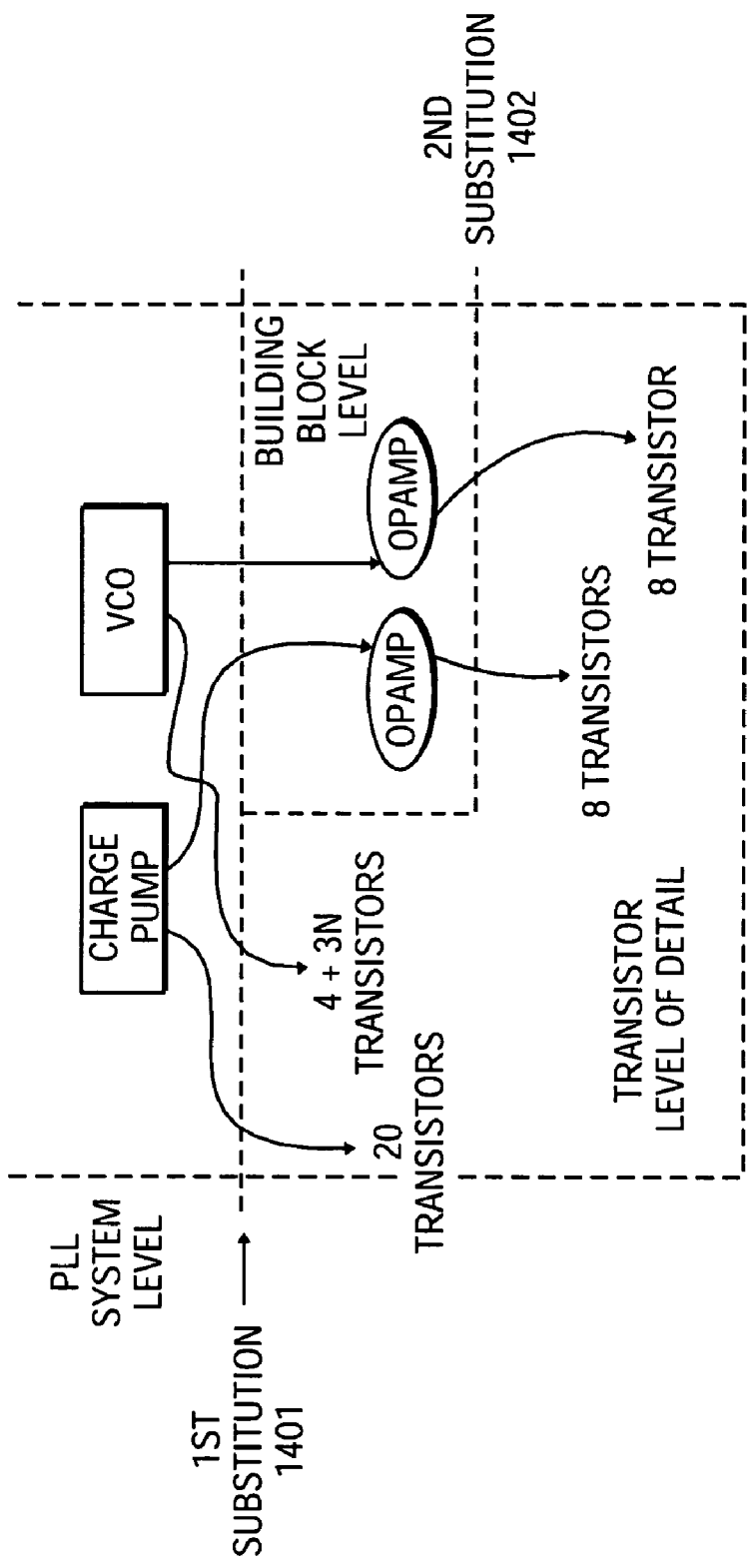
FIG. 14 shows an example of different thread lengths and thread paths for drilling down to a transistor level of detail.

FIG. 14 shows the various threading paths and threading lengths that may arise as a PLL is automatically developed by continuously substituting lower levels of detail into higher levels of detail. FIG. 14 shows how the both the charge pump and vco can be expanded into a transistor level of detail. Here, as observed in FIGS. 8c and 9c both the charge pump and VCO are described in terms of an opamp and a plurality of transistors (20 transistors in the case of the charge pump and 4+3N transistors in the case of the VCO). As such a first substitution 1401 (for both the charge pump and VCO) will bring the PLL closer to a transistor level of detail by 24+3N transistors. However, because of the opamps, both the charge pump and VCO will not be broken down completely into transistor level terms until a second substitution 1402 is made that effectively substitutes transistor level information for each of the opamps (e.g., as described with respect to FIGS. 3a and 3b).

Figure 15:
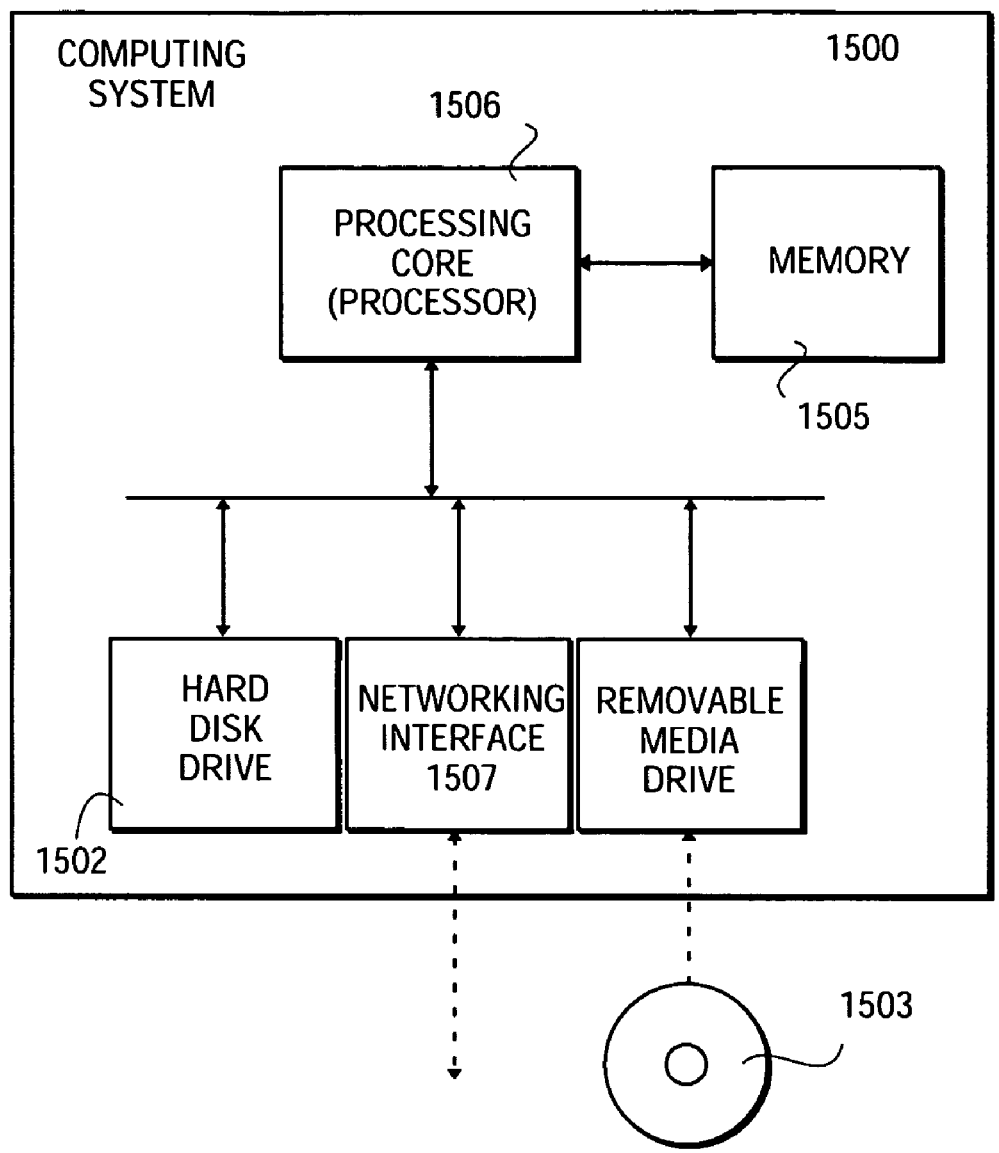
FIG. 15 shows an embodiment of a computing system.

FIG. 15 shows an embodiment of a computing system 1500 that can execute instructions residing on a machine readable medium (noting that other (e.g., more elaborate) computing system embodiments are possible). The instructions may be related to integrated circuit design (e.g., as described in FIGS. 2a through 15). In one embodiment, the machine readable medium may be a fixed medium such as a hard disk drive 1502. In other embodiments, the machine readable medium may be movable such as a CD ROM 1503, a compact disc, a magnetic tape, etc. The instructions (or portions thereof) that are stored on the machine readable medium are loaded into memory (e.g., a Random Access Memory (RAM)) 1505; and, the processing core 1506 (e.g., a central processing unit comprising one or more processors) then executes the instructions. The instructions may also be received through a network interface 1507 prior to their being loaded into memory 1505.

Thus, it is also to be understood that embodiments of this invention may be used as or to support a software program executed upon some form of processing core (such as the Central Processing Unit (CPU) of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A method comprising:
   executing software instructions using a processor to develop a more detailed description of a phase lock loop system by substituting, into a monomial or posynomial equation that is part of a family of monomial and posynomial expressions that describe functional characteristics of said PLL at the system level, a lower level expression that describes a characteristic of one said PLL's basic building blocks;
   constructing a geometric problem with the lower level expression; and
   solving the geometric problem to generate the more detailed description of the phase lock loop system, the more detailed description of the phase lock loop system comprising a transistor-level netlist.

2. The method of claim 1, further comprising:
   recognizing a variable within the monomial or posynomial expression for one of the functional characteristics of said PLL as having a dependency on the lower level expression.

3. The method of claim 2, further comprising substituting the lower level expression into the monomial or posynomial equation to replace the variable within the monomial or posynomial expression.

4. A machine-readable medium embodying instructions, the instructions, when executed by a processor, causing the processor to perform operations comprising:
   developing a more detailed description of a phase lock loop system by substituting, into a monomial or posynomial equation that is part of a family of monomial and posynomial expressions that describe functional characteristics of said PLL at the system level, a lower level expression that describes a characteristic of one said PLL's basic building blocks;
   constructing a geometric problem with the lower level expression; and
   solving the geometric problem to generate the more detailed description of the phase lock loop system, the more detailed description of the phase lock loop system comprising a transistor-level netlist.

5. The machine-readable medium in claim 4, wherein the operations further comprise:
   recognizing a variable within the monomial or posynomial expression for one of the functional characteristics of said PLL as having a dependency on the lower level expression.

6. The machine-readable medium in claim 5, wherein the operations further comprise substituting the lower level expression into the monomial or posynomial equation to replace the variable within the monomial or posynomial expression.

* * * * *